United States Patent
Sunohara et al.

(10) Patent No.: US 7,498,200 B2
(45) Date of Patent: Mar. 3, 2009

(54) ELECTRONIC-PARTS-PACKAGING STRUCTURE IN WHICH A SEMICONDUCTOR CHIP IS MOUNTED ON A WIRING SUBSTRATE AND BURIED IN AN INSULATION FILM

(75) Inventors: Masahiro Sunohara, Nagano (JP); Kei Murayama, Nagano (JP); Mitsutoshi Higashi, Nagano (JP); Toshinori Koyama, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 11/798,814

(22) Filed: May 17, 2007

(65) Prior Publication Data
US 2007/0224731 A1    Sep. 27, 2007

Related U.S. Application Data

(62) Division of application No. 10/756,763, filed on Jan. 14, 2004, now Pat. No. 7,285,862.

(30) Foreign Application Priority Data
Jan. 23, 2003  (JP) ............................. 2003-014588
Nov. 17, 2003 (JP) ............................. 2003-386398

(51) Int. Cl.
*H01L 21/02* (2006.01)
(52) U.S. Cl. ............................ 438/108; 257/E21.002
(58) Field of Classification Search ............... 438/108; 257/E21.002
See application file for complete search history.

(56) References Cited
U.S. PATENT DOCUMENTS
3,757,175 A    9/1973    Kim et al. ............... 317/234
4,437,235 A  *  3/1984   McIver ....................... 29/840

(Continued)

FOREIGN PATENT DOCUMENTS
EP    0 954 208    11/1999

(Continued)

OTHER PUBLICATIONS

European Office Action dated Dec. 29, 2006 for the corresponding European Application No. 04 250 386.2-2003.
Peter Van Zant, Microchip fabrication: a practical guide to semiconductor processing—2nd ed., 1990, ISBN: 0-07-067194-X, pp. 97-98 and pp. 469-470.
European Search Report dated Jun. 17, 2004.
Partial European Search Report dated Apr. 29, 2004.

*Primary Examiner*—Matthew Smith
*Assistant Examiner*—Walter H Swanson
(74) *Attorney, Agent, or Firm*—Kratz, Quintos & Hanson, LLP

(57) ABSTRACT

The present invention includes the steps of forming a first resin film uncured on a wiring substrate including a wiring pattern, burying an electronic parts having a connection terminal on an element formation surface in the first resin film uncured in a state where the connection terminal is directed upward, forming a second resin film for covering the electronic parts, obtaining an insulation film by curing the first and second resin films by heat treatment, forming a via hole in a predetermined portion of the insulation film on the wiring pattern and the connection terminal, and forming an upper wiring pattern connected to the wiring pattern and the connection terminal through the via hole, on the insulation film.

12 Claims, 13 Drawing Sheets

U.S. PATENT DOCUMENTS

| | | | |
|---|---|---|---|
| 5,111,278 A | 5/1992 | Eichelberger | 357/75 |
| 5,250,843 A | 10/1993 | Eichelberger | 257/692 |
| 5,348,607 A | 9/1994 | Wojnarowski et al. | 156/298 |
| 5,492,586 A | 2/1996 | Gorczyca | 156/245 |
| 5,565,706 A | 10/1996 | Miura et al. | 257/723 |
| 5,834,799 A * | 11/1998 | Rostoker et al. | 257/98 |
| 6,038,133 A | 3/2000 | Nakatani et al. | 361/760 |
| 6,212,768 B1 * | 4/2001 | Murakami | 29/840 |
| 6,309,912 B1 | 10/2001 | Chiou et al. | 438/118 |
| 6,489,685 B2 | 12/2002 | Asahi et al. | 257/774 |
| 6,538,210 B2 | 3/2003 | Sugaya et al. | 174/258 |
| 6,724,638 B1 | 4/2004 | Inagaki et al. | 361/763 |
| 6,822,170 B2 | 11/2004 | Takeuchi et al. | 174/258 |
| 6,876,091 B2 | 4/2005 | Takeuchi et al. | 257/793 |
| 6,909,054 B2 | 6/2005 | Sakamoto et al. | 174/260 |
| 6,919,226 B2 | 7/2005 | Ogawa et al. | 438/108 |
| 6,952,049 B1 | 10/2005 | Ogawa et al. | 257/700 |
| 2001/0004130 A1 * | 6/2001 | Higashi et al. | 257/686 |
| 2002/0004257 A1 | 1/2002 | Takaoka et al. | 438/107 |
| 2002/0105073 A1 | 8/2002 | Smith | 257/730 |
| 2002/0117743 A1 * | 8/2002 | Nakatani et al. | 257/687 |
| 2002/0180063 A1 * | 12/2002 | Iwaki et al. | 257/778 |
| 2003/0015342 A1 * | 1/2003 | Sakamoto et al. | 174/250 |
| 2003/0102547 A1 | 6/2003 | Higashi et al. | 257/686 |
| 2003/0178726 A1 | 9/2003 | Ogawa | 257/758 |
| 2004/0014317 A1 | 1/2004 | Sakamoto et al. | 438/689 |
| 2005/0112798 A1 | 5/2005 | Bjorball | 438/106 |
| 2005/0230835 A1 | 10/2005 | Sunohara et al. | 257/758 |
| 2005/0288392 A1 | 12/2005 | Okubora | 523/176 |
| 2006/0023439 A1 | 2/2006 | Fraley et al. | 361/780 |

FOREIGN PATENT DOCUMENTS

| | | |
|---|---|---|
| EP | 1 225 629 | 7/2002 |
| EP | 1 259 103 A1 | 11/2002 |
| JP | 09-321439 | 12/1997 |
| JP | 2000-223837 | 8/2000 |
| JP | 2000-323645 | 11/2000 |
| JP | 2001-177045 | 6/2001 |
| JP | 2002-170840 | 6/2002 |
| JP | 2003-100937 | 4/2003 |

* cited by examiner

ELECTRONIC-PARTS-PACKAGING STRUCTURE IN WHICH A SEMICONDUCTOR CHIP IS MOUNTED ON A WIRING SUBSTRATE AND BURIED IN AN INSULATION FILM

This application is a Divisional of prior application Ser. No. 10/756,763, filed on Jan. 14, 2004 now U.S. Pat. No. 7,285,862, which is hereby incorporated by reference.

BACKGROUND OF THE INVENTION

1. Field of the Invention

The present invention relates to an electronic-parts-packaging structure and a method of manufacturing the same, more particularly, an electronic parts packaging structure in which a semiconductor chip or the like is mounted on a wiring substrate in the state where the semiconductor chip or the like is buried in an insulation film, and a method of manufacturing the same.

2. Description of the Related Art

The development of the LSI technology as a key technology to implement multimedia devices is proceeding steadily to a higher speed and a larger capacity of the data transmission. According to this, a higher density of the packaging technology as interfaces between the LSI and electronic devices is also proceeding.

Based on demands for further density growth, semiconductor devices in which a plurality of semiconductor chips are three-dimensionally stacked and mounted on a wiring substrate have been developed. To cite an example, each of Patent Literature 1 (Japanese Unexamined Patent Publication No. 2001-177045) and Patent Literature 2 (Japanese Unexamined Patent Publication No. 2000-323645) discloses a semiconductor device having a structure as follows: a plurality of semiconductor chips are three-dimensionally mounted on a wiring substrate in the state where the semiconductor chips are buried in insulation films, and the plurality of semiconductor chips are mutually connected using multilayered wiring patterns or the like formed with the insulation films interposed therebetween.

However, in the above-described Patent Literatures 1 and 2, there is no consideration for the fact that an interlayer insulation film is formed in the state where steps are generated due to the thickness of a semiconductor chip when the interlayer insulation film is formed on the mounted semiconductor chip.

Specifically, if steps are generated in the interlayer insulation film on the semiconductor chip, defocus is apt to occur in photolithography when wiring patterns are formed on the interlayer insulation film. Accordingly, it is difficult to form desired wiring patterns with high precision.

Furthermore, since steps are also generated in the wiring patterns formed on the interlayer insulation film, reliability of bonding may be lowered when a semiconductor chip is flip-chip bonded to the wiring patterns.

SUMMARY OF THE INVENTION

An object of the present invention is to provide a method of manufacturing an electronic-parts-packaging structure which has a structure where an electronic parts is buried in an interlayer insulation film on a wiring substrate and in which steps due to the thickness of the electronic parts can be easily eliminated to be planarized, and to provide the electronic-parts-packaging structure.

The present invention relates to a method of manufacturing an electronic-parts-packaging structure, which includes the steps of: forming a first resin film uncured on a wiring substrate including a wiring pattern; burying an electronic parts having a connection terminal on an element formation surface in the first resin film uncured in a state where the connection terminal is directed upward; forming a second resin film for covering the electronic parts; obtaining an insulation film by curing the first and second resin films by heat treatment; forming a via hole in a predetermined portion of the insulation film on the wiring pattern and the connection terminal; and forming an upper wiring pattern connected to the wiring pattern and the connection terminal through the via hole, on the insulation film.

In the present invention, first, the first resin film uncured is formed on the wiring substrate. Thereafter, the electronic parts (thinned semiconductor chip or the like) having the connection terminal on the element formation surface is pressed and buried in the first resin film in an uncured state, in the state where the connection terminal is directed upward. At this time, it is preferred that the element formation surface of the electronic parts and the upper surface of the first resin film are at almost the same height.

Next, the second resin film uncured, which covers the electronic parts, is formed. Subsequently, the first and second resin films are cured by heat treatment, thus obtaining the insulation film. Then, the via hole is formed in the insulation film on the wiring pattern and the connection terminal, and the upper wiring pattern connected to the wiring pattern and the connection terminal through the via hole is formed on the insulation film.

As described above, in the present invention, without adding any special planarization process, the electronic parts is buried in the insulation film to be mounted in the state where steps due to the thickness of the electronic parts are eliminated. This eliminates the possibility that defocus may occur in photolithography when the upper wiring pattern is formed above the electronic parts. Accordingly, the upper wiring pattern can be stably formed with high precision.

Moreover, in the case where an upper electronic parts is flip-chip mounted on the upper wiring patterns above the electronic parts, reliability of the joint between upper electronic parts and the upper wiring patterns can be improved because the upper wiring patterns are placed at almost the same height over the entire wiring substrate.

In the aforementioned invention, it is preferred that the first resin film is interposed between the backside of the electronic parts and the wiring substrate. Since the first resin film functions as an adhesive layer for adhering the electronic parts and the wiring substrate, the packaging structure is simplified, and reliability of the packaging structure can be improved.

Further, in the case where an electronic parts including a passivation film having an opening portion for exposing the connection terminal is used as the electronic parts in the aforementioned invention, the second resin film may be omitted, and the upper wiring pattern is formed directly on the electric parts.

Also, the present invention relates to a method of manufacturing an electronic-parts-packaging structure, which includes the steps of: forming a first resin film uncured on a wiring substrate including a wiring pattern; burying an electronic parts having a connection terminal on an element formation surface in the first resin film uncured in a state where the connection terminal is directed downward, and joining the connection terminal to the wiring pattern; forming a second resin film for covering the electronic parts; obtaining an insulation film by curing the first and second resin films by heat treatment; forming a via hole in a predetermined portion of the insulation film on the wiring pattern; and forming an upper wiring pattern connected to the wiring pattern through the via hole, on the insulation film.

In the present invention, first, the first resin film uncured is formed on the wiring substrate. Thereafter, the electronic parts (thinned semiconductor chip or the like) is buried in the first resin film uncured, in the state where the connection terminal is directed downward, and the connection terminal of the electronic parts is flip-chip bonded to the wiring pattern. At this time, it is preferred that the backside of the electronic parts and the upper surface of the first resin film be adjusted so as to be at almost the same height.

Next, after the second resin film for covering the electronic parts is formed, the first and second resin films are cured by heat treatment to become the insulation film. Then, after the via hole is formed in the insulation film on the wiring pattern, the upper wiring pattern connected to the wiring pattern through the via hole is formed on the insulation film.

As described above, without adding any special planarization process, the electronic parts is buried in the insulation film in the state where steps due to the thickness of the electronic parts are eliminated, and the connection terminal of the electronic parts can be flip-chip bonded to the wiring pattern of the wiring substrate. Accordingly, similar to the aforementioned invention, the upper wiring pattern formed above the electronic parts can be formed with high precision. In addition, in the case where an upper electronic parts is flip-chip mounted on the upper wiring pattern, .they are joined with high reliability.

Moreover, since underfill resin does not need to be specially formed in the gap under the electronic parts, the cost of manufacture can be reduced.

In the aforementioned invention, the second resin film for covering the electronic parts may be omitted. In this case, particularly in the case where a thinned semiconductor chip is used as the electronic parts, it is preferred that the upper wiring pattern not be placed on the semiconductor chip for preventing a circuit pattern of the semiconductor chip and the upper wiring pattern from being short-circuited.

Further, in the aforementioned invention, after the process of forming the resin film uncured, an opening portion may be formed in a predetermined portion of the resin film on the wiring pattern to which the connection terminal of the electronic parts is joined. In this case, the connection terminal of the electronic parts is joined to the wiring pattern while being placed so as to correspond to the opening portion of the resin film. In the case of this aspect, the possibility that resin may be interposed between the connection terminal of the electronic parts and the wiring pattern is eliminated. Accordingly, reliability of the electric connection between the electronic parts and the wiring pattern can be improved.

DETAILED DESCRIPTION OF THE PREFERRED EMBODIMENTS

Hereinafter, embodiments of the present invention will be described with reference to the accompanying drawings.

Figure 1A:
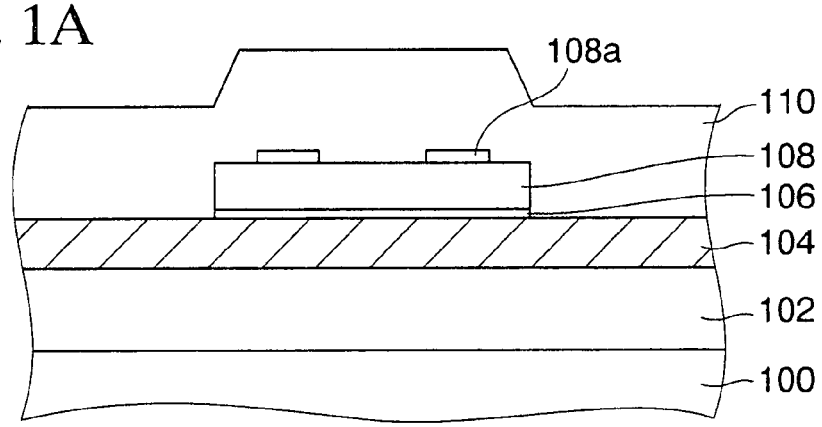
FIGS. 1A and 1B are sectional views showing disadvantageous points in the manufacture of a semiconductor device in which a semiconductor chip is mounted in the state of being buried in an insulation film.
Figure 1B:
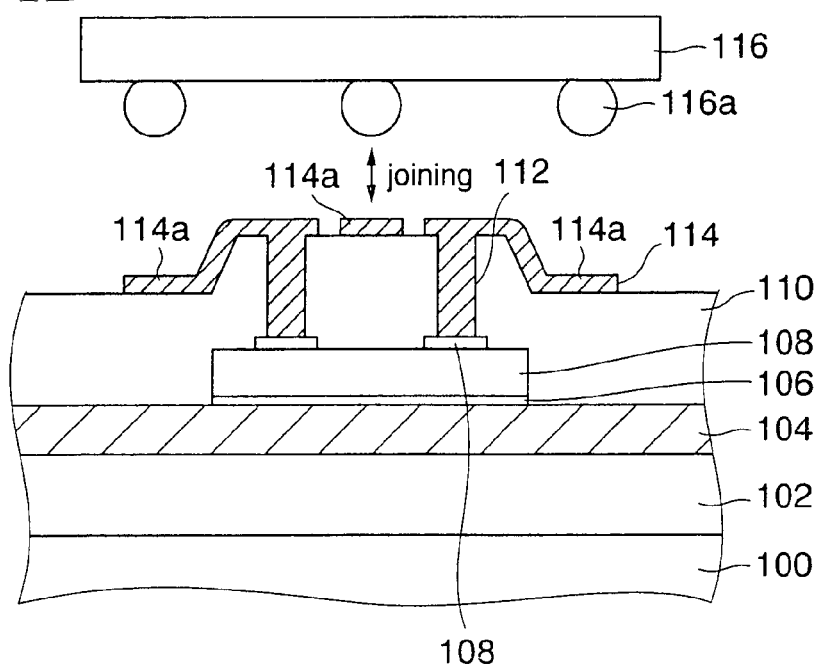

Before the present embodiments will be described, disadvantageous points in the manufacture of a semiconductor device in which a semiconductor chip is mounted in the state of being buried in an insulation film will be described. FIGS. 1A and 1B are sectional views showing the disadvantageous points in the manufacture of a semiconductor device in which a semiconductor chip is mounted in the state of being buried in an insulation film.

As shown in FIG. 1A, first, a first interlayer insulation film 102 is formed on a base substrate 100 including predetermined wiring patterns (not shown), and then a Cu wiring 104 connected to the wiring patterns of the base substrate 100 through via holes (not shown) formed in the first interlayer insulation film 102 is formed on the first interlayer insulation film 102. A semiconductor chip 108 including connection terminals 108a is firmly fixed to the Cu wiring 104 with an adhesive layer 106 interposed therebetween in the state where the connection terminals 108a are directed upward.

Subsequently, a second interlayer insulation film 110 is formed on the semiconductor chip 108 and the Cu wiring 104. At this time, the second interlayer insulation film 110 is formed in the state where it rises higher on the semiconductor chip 108 than on the Cu wiring 104 due to steps of the semiconductor chip 108.

Then, as shown in FIG. 1B, via holes 112 are formed by etching the second interlayer insulation film 110 on the connection terminals 108a and the like of the semiconductor chip 108 with a laser or the like. Subsequently, after a seed Cu film (not shown) is formed on the inner surfaces of the via holes 112 and on the second interlayer insulation film 110, a resist film (not shown) in which portions where wiring patterns are to be formed are opened is formed by photolithography.

Next, after a Cu film pattern is formed in opening portions of the resist film pattern by electroplating in which the seed Cu film is utilized as a plating power-supply layer, the resist film is removed. Subsequently, the seed Cu film is etched using the Cu film pattern as a mask, thus obtaining the wiring patterns 114.

Since steps are generated on the upper surface of the second interlayer insulation film 110 under the influence of the semiconductor chip 108, defocus is apt to occur in photolithography when the aforementioned resist film pattern is formed. Accordingly, troubles are apt to occur in the resist film pattern formed on the second interlayer insulation film 110. Therefore, it is difficult to form the wiring patterns 114 desired, with high precision.

Subsequently, bumps 116a of the semiconductor chip 116 including the bumps 116a are flip-chip bonded to connection portions 114a of the wiring patterns 114. At this time, since the heights of the connection portions 114a of the wiring patterns 114 vary due to the steps of the second interlayer insulation film 110, bonding failures between the bumps 116a of the semiconductor chip 116 and the connection portions 114a of the wiring patterns 114 are apt to occur.

Electronic-parts-packaging structures of embodiments of the present invention and methods of manufacturing the same, described below, can solve the above-described problems.

First Embodiment

Figure 2A:
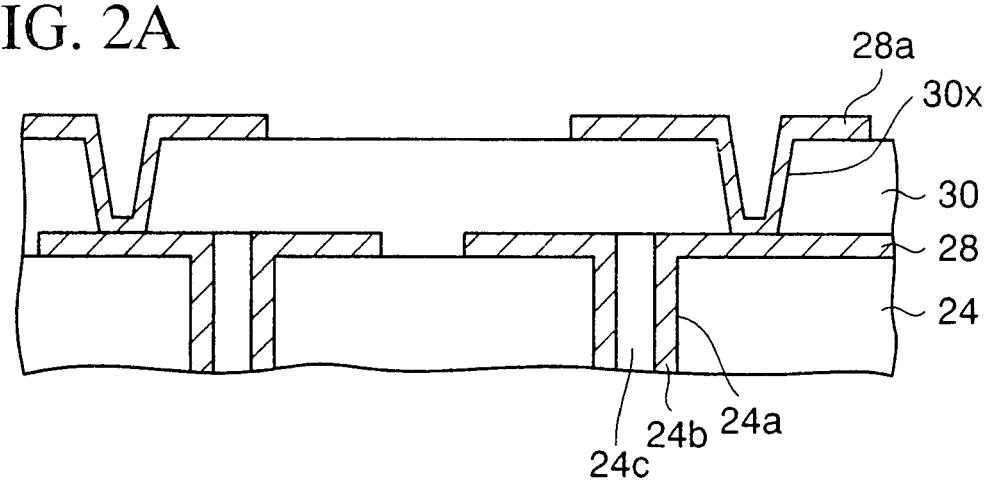
FIGS. 2A to 2H are sectional views showing a method of manufacturing an an electronic-parts-packaging structure of a first embodiment of the present invention in order.

Next, a method of manufacturing an electronic-parts-packaging structure of a first embodiment of the present invention will be described. FIGS. 2A to 2H are sectional views showing the method of manufacturing the electronic-parts-packaging structure of the first embodiment of the present invention in order. In the method of manufacturing electronic-parts-packaging structure of the first embodiment, as shown in FIG. 2A, first, a base substrate 24 for manufacturing a build-up wiring substrate is prepared. The base substrate 24 is made of insulative material such as resin. Moreover, through-holes 24a are provided in the base substrate 24, and through-hole plating layers 24b connected to first wiring patterns 28 on the base substrate 24 are formed on the inner surfaces of the through-holes 24a. Holes of the through-hole plating layers 24b are filled with resin 24c.

Thereafter, a first interlayer insulation film 30 made of resin or the like, which covers the first wiring patterns 28, is formed. Then, predetermined portions of the first interlayer insulation film 30 on the first wiring patterns 28 are etched by a laser, RIE, or the like, thereby forming first via holes 30x.

Subsequently, second wiring patterns 28a connected to the first wiring patterns 28 through the first via holes 30x are formed on the first interlayer insulation film 30. The second wiring patterns 28a are formed by a similar method to that of forming third wiring patterns to be described later.

Figure 2B:
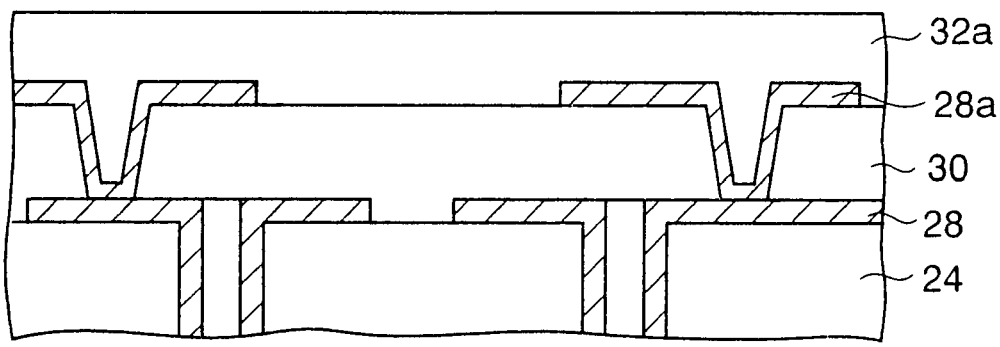

Next, as shown in FIG. 2B, a first resin film 32a is formed on the second wiring patterns 28a and the first interlayer insulation film 30. As the first resin film 32a, epoxy series resin, polyimide series resin, polyphenylene ether series resin, or the like is used. Methods of forming the first resin film 32a include a method of laminating a resin film and a method of forming a resin film by spin coating or printing.

In general, a resin film is formed by curing uncured resin material by heat treatment. However, one feature of the present embodiment is that a semiconductor chip is buried in a soft resin film in an uncured state. Accordingly, in this step, the first resin film 32a is formed in an uncured state. That is, after resin material as described above is formed, the resin material is baked at 50 to 100° C. in order to be stuck tentatively, thus forming the first resin film 32a uncured.

The thickness of the first resin film 32a is not particularly limited because it is set in consideration of the thickness of a semiconductor chip to be buried therein. However, the thickness of the first resin film 32a is preferably set to approximately twice the thickness of the semiconductor chip.

Figure 2C:
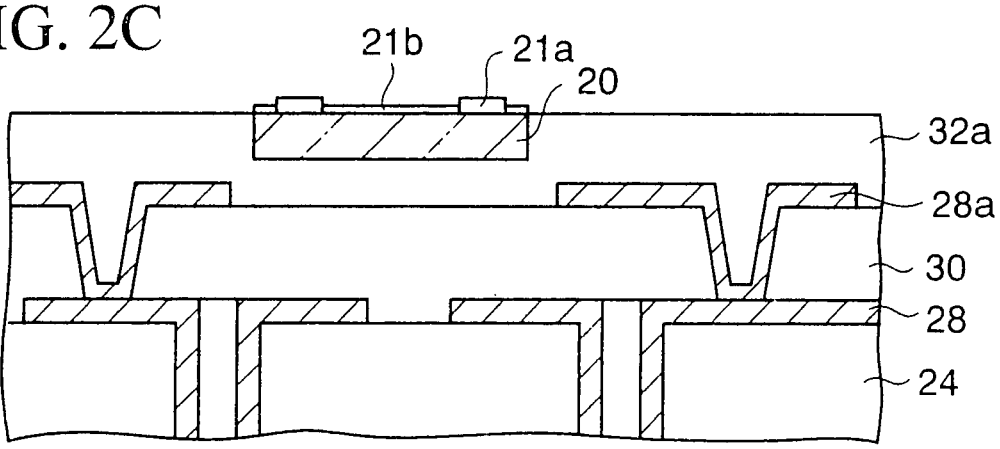

Subsequently, a semiconductor chip 20 (electronic parts) as shown in FIG. 2C is prepared. Connection pads 21a (connection terminals) are exposed on the element formation surface of the semiconductor chip 20, and the other part of the semiconductor chip 20 is covered with a passivation film 21b. In order to obtain this semiconductor chip 20, first, a semiconductor wafer which has a thickness of approximately 400 μm and which includes elements, such as transistors, and the connection pads 21a connected to the elements on the element formation surface is prepared. Thereafter, the backside of the semiconductor wafer is ground and thinned to a thickness of approximately 150 μm (preferably, approximately 50 μm) or less, and then the semiconductor wafer is diced, thus obtaining individual semiconductor chips 20.

Although the semiconductor chip 20 is taken as an example of an electronic parts, various kinds of electronic parts including capacitor parts can be used.

Thereafter, as shown in FIG. 2C, the semiconductor chip 20 is placed on the first resin film 32a with the element formation surface up (face up), and then the semiconductor chip 20 is pressed, thereby excluding the first resin film 32a uncured to bury the semiconductor chip 20 therein. At this time, the semiconductor chip 20 is buried in the first resin film 32a so that the element formation surface of the semiconductor chip 20 and the upper surface of the first resin film 32a may be at almost the same height. This eliminates the occurrence of steps due to the thickness of the semiconductor chip 20 and makes it possible to achieve planarization without specially adding a planarization process.

Note that, of course, the height of the element formation surface of the semiconductor chip 20 and that of the upper surface of the first resin film 32a may be different from each other to a degree in which photolithography and the like in subsequent steps are not adversely affected.

FIG. 2C illustrates a mode in which the semiconductor chip 20 having a thickness of approximately 30 fÊm is buried in the first resin film 32a having a thickness of approximately 60 fÊm so that the upper surfaces thereof may be at almost the same height. Thus, in the present embodiment, it is preferred that the first resin film 32a is interposed between the backside of the semiconductor chip 20 and the first interlayer insulation film 30 (or the second wiring patterns 28a) below the semiconductor chip 20.

This is because the first resin film 32a interposed between the backside of the semiconductor chip 20 and the first interlayer insulation film 30 functions as an adhesive layer for adhering the semiconductor chip 20 and the first interlayer insulation film 30. Thus, the present embodiment also has the advantage that the step of forming an adhesive layer on the backside of the semiconductor chip 20 can be omitted, and is convenient from the viewpoint that the cost of manufacture can be reduced.

Incidentally, the semiconductor chip 20 may be buried in the first resin film 32a so that the backside of the semiconductor chip 20 may come into contact with the first interlayer insulation film 30 or the first wiring patterns 28a by adjusting the thicknesses of the semiconductor chip 20 and the first resin film 32a. Also in this case, it is preferred that the element formation surface of the semiconductor chip 20 and the upper surface of the first resin film 32a are at almost the same height.

Figure 2D:
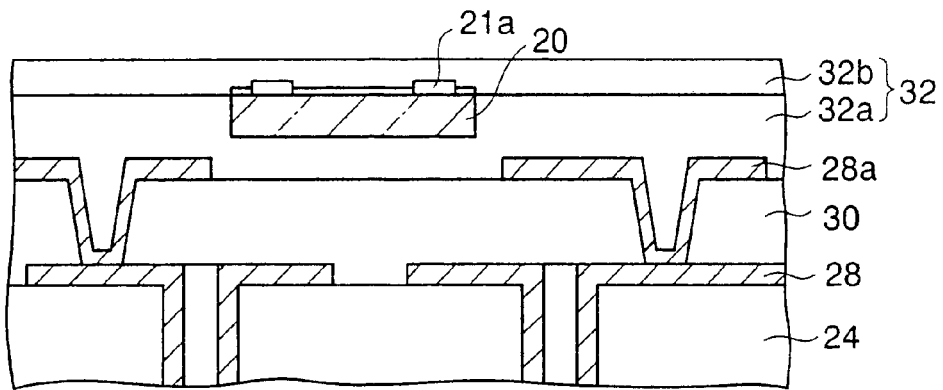

Next, as shown in FIG. 2D, a second resin film 32b uncured which covers the semiconductor chip 20 is formed. The second resin film 32b is formed by using material and a forming method similar to those of the first resin film 32a. The steps of the element formation surface due to the semiconductor chip 20 are planarized by covering the semiconductor chip 20 with the second resin film 32b.

Since the semiconductor chip 20 is buried in the first resin film 32a to be mounted as described above, the second resin film 32b cannot be formed in the state where it locally rises on the semiconductor chip 20, but formed in the state where it is planarized over all.

Subsequently, the structure of FIG. 2D is heat-treated at a temperature of 130 to 200° C., thereby simultaneously curing the first and second resin films 32a and 32b. At this time, heat treatment may be performed while the first and second resin films 32a and 32b are pressed in a vacuum environment. By executing vacuum pressing, the second resin film 32b is cured in the state where the upper surface thereof is further planarized.

In this way, a second interlayer insulation film 32 composed of the first resin film 32a (first insulating film) and the second resin film 32b (second insulation film) is obtained.

Figure 2E:
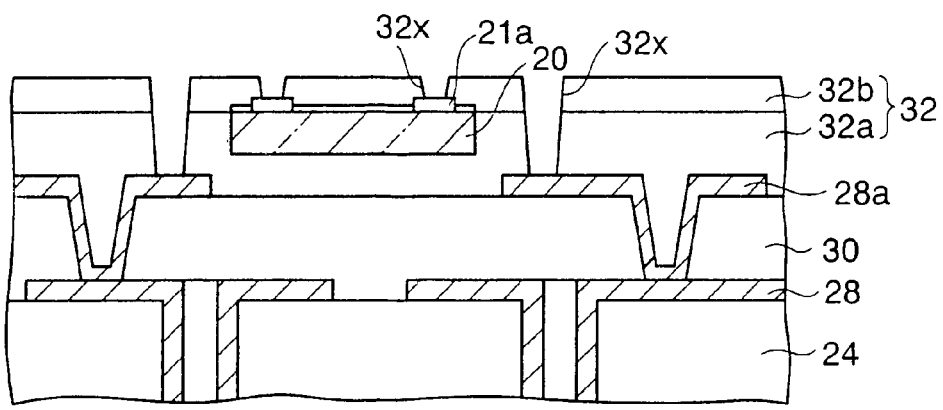

Next, as shown in FIG. 2E, predetermined portions of the second interlayer insulation film 32 on the connection pads 21a of the semiconductor chip 20 and on the second wiring patterns 28a are etched by a laser, RIE, or the like, thereby forming second via holes 32x.

Figure 2F:
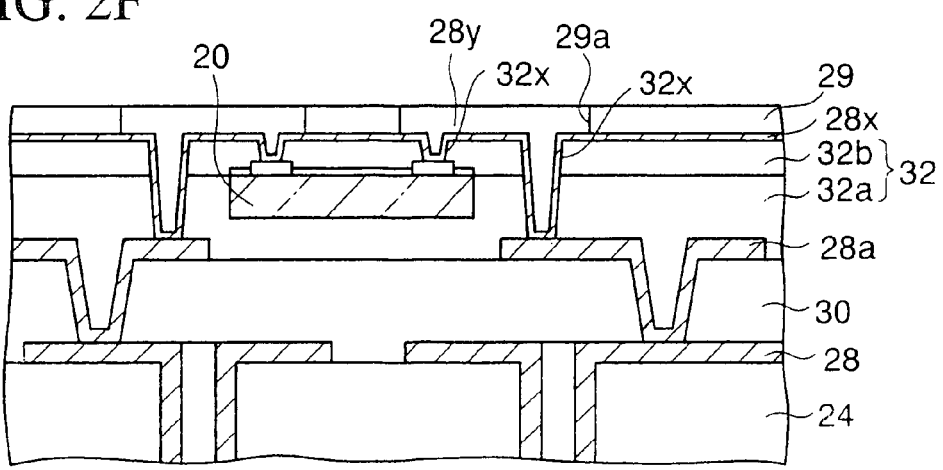

Thereafter, as shown in FIG. 2F, a seed Cu film 28x is formed on the inner surfaces of the second via holes 32x and on the second interlayer insulation film 32. Then, a resist film 29 which has opening portions 29a corresponding to the third wiring patterns is formed by photolithography. At this time, since the second interlayer insulation film 32 is formed in the state where the upper surface thereof is planarized over all, defocus does not occur in photolithography. Accordingly, the resist film 29 having a predetermined pattern can be stably formed with high precision.

Subsequently, again as shown in FIG. 2F, by using the resist film 29 as a mask, a Cu film pattern 28y is formed by electroplating in which the seed Cu film 28x is utilized as a plating power-supply layer.

Figure 2G:
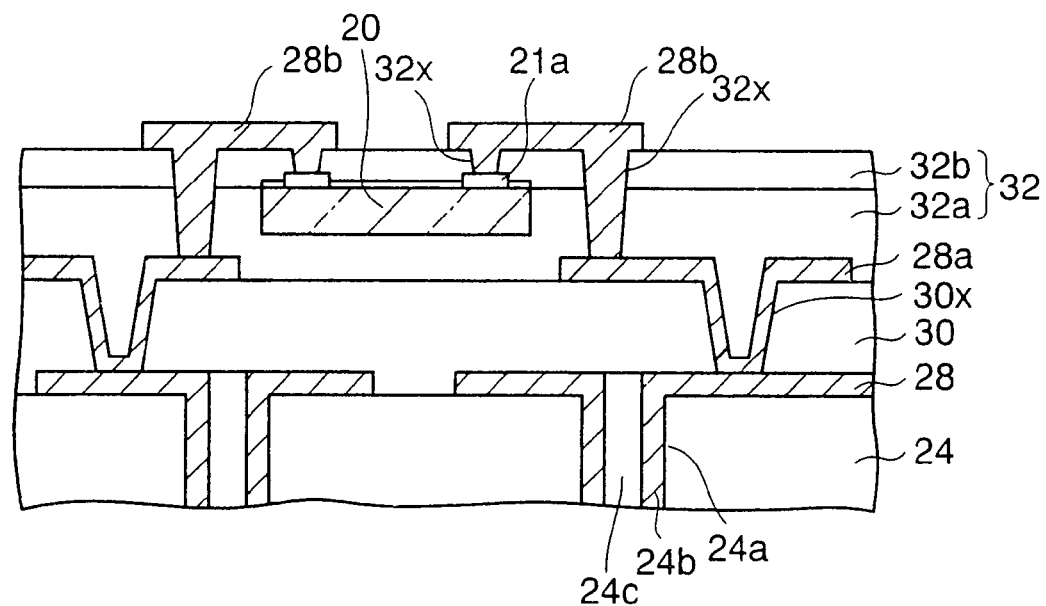

Then, after the resist film 29 is removed, the seed Cu film 28x is etched by using the Cu film pattern 28y as a mask. Thus, as shown in FIG. 2G, the third wiring patterns 28b (upper wiring patterns), which are connected to the connection pads 21a of the semiconductor chip 20 and to the second wiring patterns 28a through the second via holes 32x, are formed on the second interlayer insulation film 32.

Since the upper surface of the second interlayer insulation film 32, which covers the semiconductor chip 20, is made planar as described above, a focus margin need not be set large in photolithography when the third wiring patterns 28b are formed on the second interlayer insulation film 32. Therefore, the resist film 29, which has the opening portions corresponding to the third wiring patterns 28b, can be stably formed with high precision. Accordingly, the third wiring patterns 28b desired can be obtained.

Note that the second and third wiring patterns 28a and 28b may be formed by a subtractive process or a fully-additive process other than the aforementioned semi-additive process.

Moreover, though not shown in figures, a mode in which a plurality of semiconductor chips 20 are mutually connected in the state where they are buried in respective interlayer insulation films to be multilayered, may be adopted by repeating the process from the step (FIG. 2B) of forming the first resin film 32a to the step (FIG. 2G) of forming the third wiring patterns 28b with a predetermined number of times. Also in such a case, each interlayer insulation film is formed in a planarized state. Accordingly, interlayer insulation films having semiconductor chips therein and wiring patterns can be formed in a stacking manner without any trouble.

Further, a mode in which semiconductor chips 20 are similarly buried in arbitrary interlayer insulation films among the plurality of interlayer insulation films may also be adopted. Furthermore, a mode in which a semiconductor chip 20 is also stacked on the backside of the base substrate 24 in the state where the semiconductor chip 20 is buried in an interlayer insulation film may also be adopted.

Figure 2H:
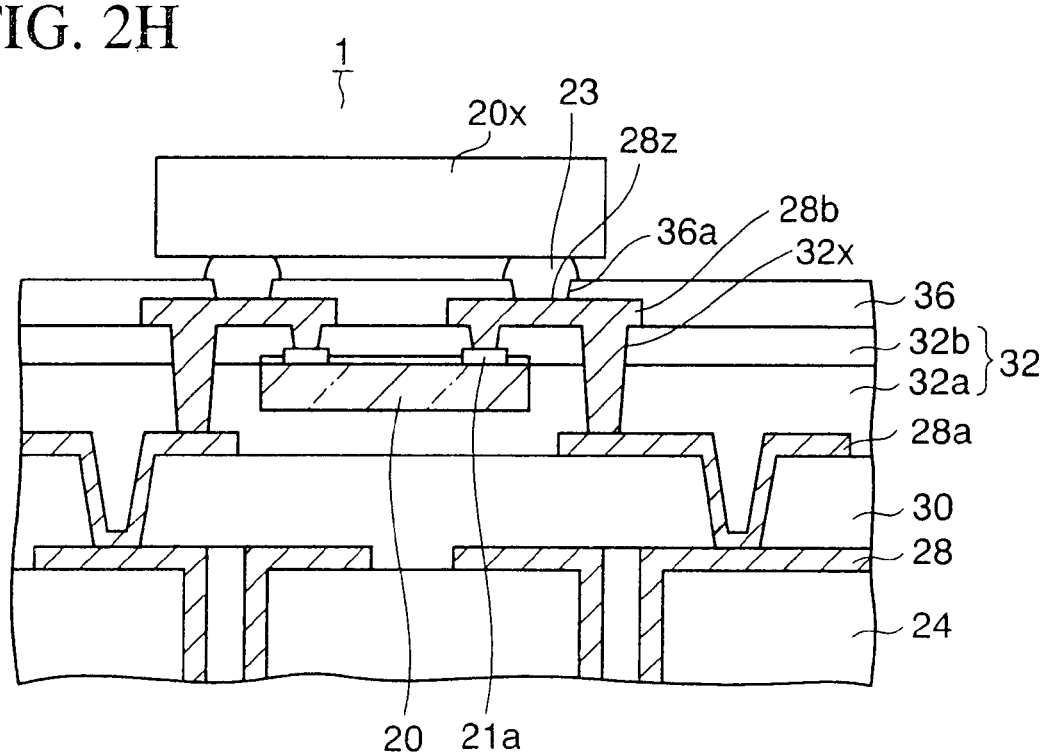

Next, as shown in FIG. 2H, a solder resist film 36 having opening portions 36a on connection portions 28z of the third wiring patterns 28b, is formed. Then, the connection portions 28z of the third wiring patterns 28b are plated with Ni/Au.

Subsequently, an upper semiconductor chip 20x (upper electronic parts) having bumps 23 is prepared, and the bumps 23 of the upper semiconductor chip 20x are flip-chip bonded to the connection portions 28z of the third wiring patterns 28b.

At this time, since the connection portions 28z of the third wiring patterns 28b are placed at almost the same height without variation in height in a region above the semiconductor chip 20 and in a region where the semiconductor chip 20 does not exist, the bumps 23 of the upper semiconductor chip 20x can be joined to the connection portions 28z with high reliability.

Note that the following may be adopted: bumps are formed by mounting solder balls, etc. on the opening portions 36a of the solder resist 36, and connection terminals of the upper semiconductor chip 20x are joined to these bumps.

In this way, a semiconductor device 1 (electronic-parts-packaging structure) of the first embodiment of the present invention is completed.

In the semiconductor device 1 of the first embodiment, the first and second interlayer insulation films 30 and 32 and the first to third wiring patterns 28 to 28b are formed on the base substrate 24 in a stacking manner. Moreover, the semiconductor chip 20 is mounted in the state of being buried face up in a central portion of the second interlayer insulation film 32.

That is, the semiconductor chip 20 is mounted in the state where it is not in contact with the first interlayer insulation film 30 (or the second wiring patterns 28a) below the semiconductor chip 20, and the second interlayer insulation film 32 is interposed between the semiconductor chip 20 and the first interlayer insulation film 30. The second interlayer insulation film 32 interposed between the backside of the semiconductor chip 20 and the first interlayer insulation film 30 also has a function of an adhesive layer for adhering these. As described above, an adhesive layer does not have to be specially provided on the backside of the semiconductor chip 20. Accordingly, the structure of the semiconductor device 1 can be simplified, and the reliability thereof can be improved.

Moreover, the connection pads 21a of the semiconductor chip 20 are electrically connected through the third wiring patterns 28b to the upper semiconductor chip 20x and the like mounted above the semiconductor chip 20.

In the method of manufacturing the semiconductor device 1 of the present embodiment, since the semiconductor chip 20 is mounted in the state of being buried in the first resin film 32a, the second resin film 32b formed on the semiconductor chip 20 is formed in a planar state without being affected the steps due to the thickness of the semiconductor chip 20. Thus, the third wiring patterns 28b formed on the second interlayer insulation film 32 are stably formed with high precision.

Further, in the first embodiment, the third wiring patterns 28b are formed on the second resin film 32b covering the semiconductor chip 20. Accordingly, even in the case where a film providing low reliability of insulation resistance is used as the passivation film 21b of the semiconductor chip 20, the possibility that the third wiring patterns 28b and circuit patterns of the semiconductor chip 20 may be electrically short-circuited is eliminated, thus making it possible to improve the reliability of the semiconductor device 1.

In addition, since the heights at which the connection portions 28z of the third wiring patterns 28b are placed are the same, coplanarity (degree of planarity) for the join between the connection portions 28z of the third wiring patterns 28b and the bumps 23 of the upper semiconductor chip 20x can be reduced. This makes it possible to prevent the occurrence of bonding failures (bridge, open, and the like) between the connection portions 28z of the third wiring patterns 28b and the bumps 23 of the upper semiconductor chip 20x.

Second Embodiment

FIGS. 3A to 3F are sectional views showing a method of manufacturing an electronic-parts-packaging structure of a second embodiment of the present invention in order. The second embodiment is different from the first embodiment in that third wiring patterns are formed directly on a semiconductor chip 20 without a second resin film being formed after the semiconductor chip is buried in a first resin film to be mounted. In the second embodiment, a detailed description of similar steps to those of the first embodiment will be omitted.

Figure 3A:
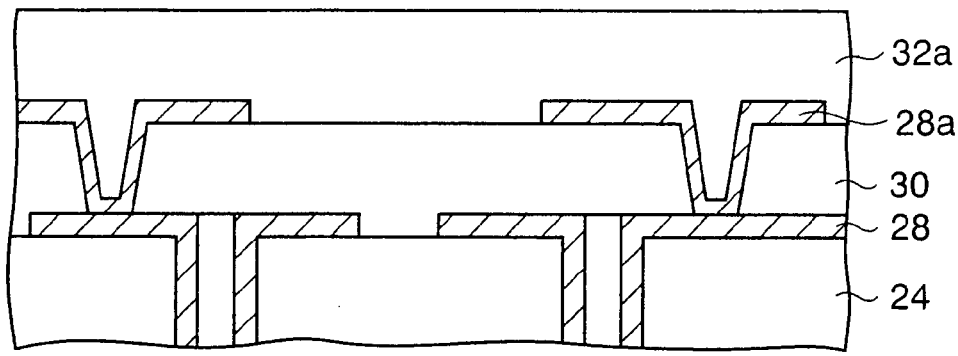
FIGS. 3A to 3F are sectional views showing a method of manufacturing an an electronic-parts-packaging structure of a second embodiment of the present invention in order.

In the method of manufacturing the electronic-parts-packaging structure of the second embodiment, as shown in FIG. 3A, first, a first resin film 32a uncured is formed on the first interlayer insulation films 30 and the second wiring patterns 28a on a base substrate 24 by a similar method to that of the first embodiment.

Figure 3B:
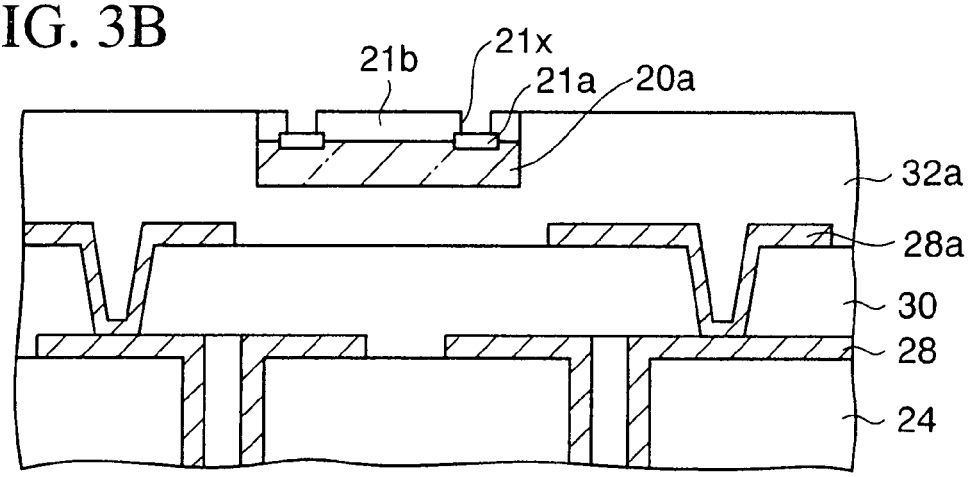

Thereafter, a semiconductor chip 20a (electronic parts) as shown in FIG. 3B is prepared. This semiconductor chip 20a has connection pads 21a on an element formation surface thereof. On the other part of the element formation surface than the connection pads 21a, a passivation film 21b (surface protection film) having opening portions 21x for exposing the connection pads 21a is provided. As the passivation film 21b according to the second embodiment, one providing high reliability of insulation resistance is used. The material and thickness of such a passivation film 21b are not particularly limited. However, for example, the passivation film 21b is composed of a silicon nitride film having a thickness of approximately 0.5 fÊm and a polyimide resin film having a thickness of approximately 3 fÊm or more. Alternatively, the passivation film 21b may be formed by adhering a resin film exposing the connection pads 21a, to the semiconductor chip 20 used in the first embodiment.

The use of the semiconductor chip 20a as described above eliminates the possibility that circuit patterns of the semiconductor chip 20a and the third wiring patterns 28b may be electrically short-circuited even if the third wiring patterns 28a are formed directly on the semiconductor chip 20a without a second resin film interposed therebetween, unlike the first embodiment.

Note that the material and structure of the passivation film of the semiconductor chip are appropriately selected in accordance with reliability specifications for various kinds of electronic-parts-packaging structures for preventing the circuit patterns of the semiconductor chip 20a and the third wiring patterns 28b from being short-circuited.

Next, again as shown in FIG. 3B, the semiconductor chip 20a is buried in the first resin film 32a to be mounted by a similar method to that of the first embodiment. Thus, the element formation surface of the semiconductor chip 20a and the upper surface of the first resin film 32a come to be at almost the same height. Accordingly, the occurrence of steps due to the thickness of the semiconductor chip 20a is eliminated.

Figure 3C:
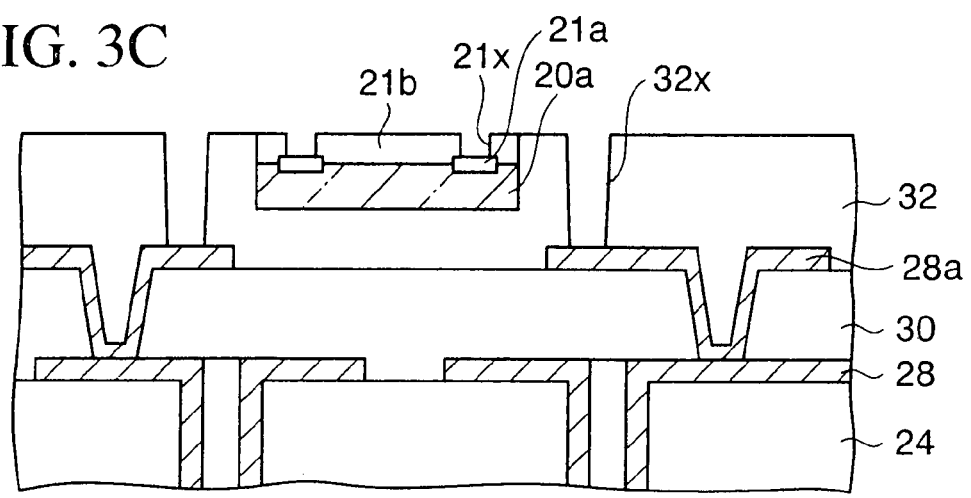

Subsequently, as shown in FIG. 3C, the structure of FIG. 3B is heat-treated at a temperature of 130 to 200° C., whereby the first resin film 32a is cured to be a second interlayer insulation film 32. Thereafter, predetermined portions of the second interlayer insulation film 32 on the second wiring patterns 28a are etched by a laser or RIE, thereby forming second via holes 32x.

Figure 3D:
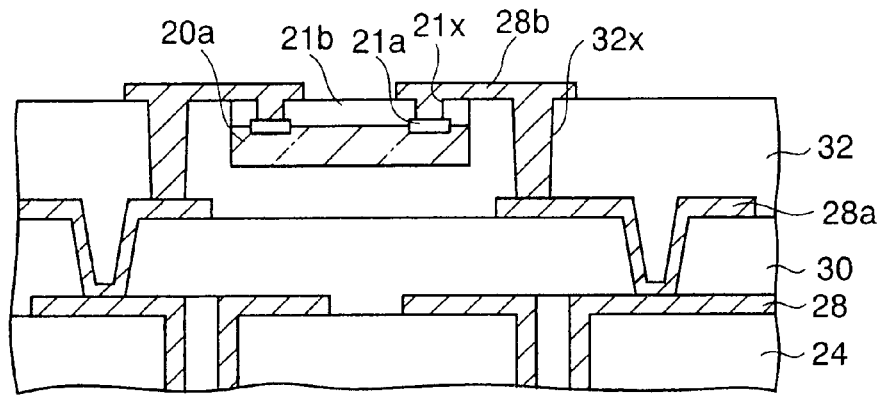

Then, as shown in FIG. 3D, the third wiring patterns 28b (upper wiring patterns) are formed on the second interlayer insulation film 32 and the semiconductor chip 20a by a semi-additive process or the like similarly to the first embodiment.

The third wiring patterns 28b are connected to the second wiring patterns 28a through the second via holes 32x and connected to the connection pads 21a of the semiconductor chip 20a through the opening portions 21x of the passivation film 21b.

In the second embodiment, since the third wiring patterns 28b can be formed directly on the semiconductor chip 20a, the step of forming a second resin film on the semiconductor chip 20a can be omitted. Accordingly, the number of steps in the manufacturing process is reduced compared to the first embodiment, thus making it possible to reduce the cost of manufacture.

Figure 3E:
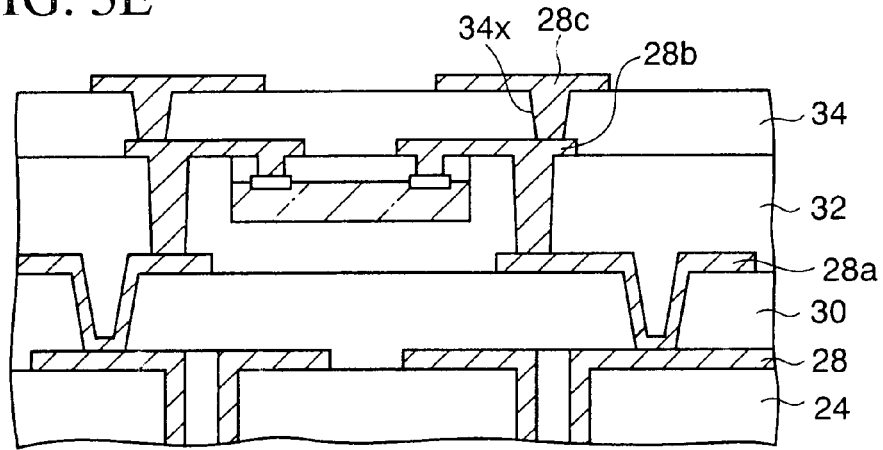

Next, in the second embodiment, a mode in which fourth wiring patterns are further formed will be illustrated. That is, as shown in FIG. 3E, a third interlayer insulation film 34, which is made of a resin film or the like and covers the third wiring patterns 28b, is formed. Subsequently, predetermined portions of the third interlayer insulation film 34 on the third wiring patterns 28b are etched by a laser or RIE, thereby forming third via holes 34x. Furthermore, fourth wiring patterns 28c connected to the third wiring patterns 28b through the third via holes 34x are formed by a semi-additive process or the like.

As described above, in the second embodiment, even in the case where a layer of wiring patterns are additionally formed, the number of steps can be reduced by one compared to the manufacturing method of the first embodiment. Accordingly, when electronic-parts-packaging structures having smaller sizes and higher performance are manufactured by increasing wiring densities, the cost of manufacture can be reduced more than the first embodiment.

Figure 3F:
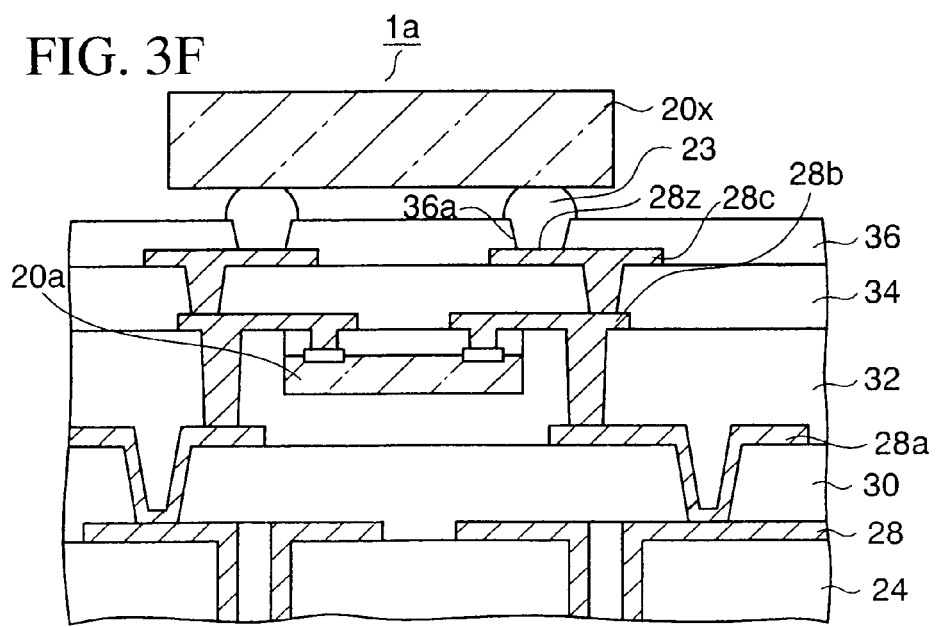

Next, as shown in FIG. 3F, a solder resist film 36 having opening portions 36a on connection portions 28z of the fourth wiring patterns 28c, is formed similarly to the first embodiment. Thereafter, bumps 23 of an upper semiconductor chip 20x are flip-chip bonded to the connection portions 28z of the fourth wiring patterns 28c.

In this way, a semiconductor device 1a (electronic-parts-packaging structure) of the second embodiment is obtained.

Also in the second embodiment, modified examples similar to those of the first embodiment can be adopted.

In the second embodiment, similar effects to those of the first embodiment are exerted. In addition, since wiring patterns can be formed directly on the semiconductor chip 20a, the number of steps in the manufacturing process can be reduced by one compared to the manufacturing process of the first embodiment, thus making it possible to reduce the cost of manufacture.

Third Embodiment

FIGS. 4A to 4D are sectional views showing a method of manufacturing an electronic-parts-packaging structure of a third embodiment of the present invention in order. The third embodiment is different from the first embodiment in that a semiconductor chip is buried face down in a resin film to be flip-chip mounted. In the third embodiment, a detailed description of the same steps as those of the first embodiment will be omitted.

Figure 4A:
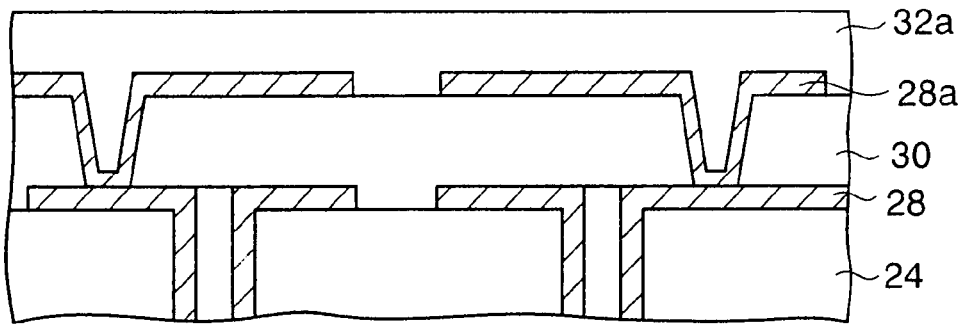
FIGS. 4A to 4D are sectional views showing a method of manufacturing an an electronic-parts-packaging structure of a third embodiment of the present invention in order.

In the method of manufacturing the electronic-parts-packaging structure of the third embodiment, as shown in FIG. 4A, first, a resin film 32a uncured is formed on a first interlayer insulation film 30 and second wiring patterns 28a on a base substrate 24 by a similar method to that of the first embodiment.

Figure 4B:
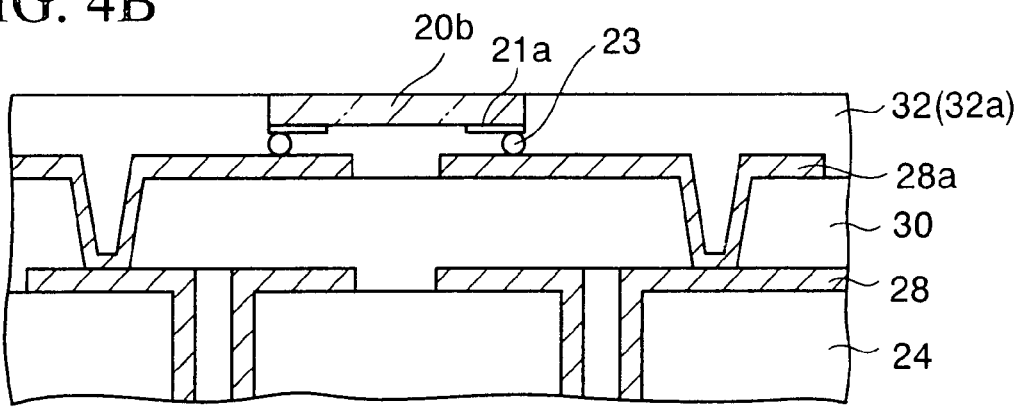

Thereafter, a semiconductor chip 20b (electronic parts) as shown in FIG. 4B is prepared. The semiconductor chip 20b has connection pads 21a and bumps 23 connected to the connection pads 21a on an element formation surface, and is thinned to 150 fÊm? (preferably, 50 fÊm?) or less. The connection pads 21a and the bumps 23 connected thereto are examples of connection terminals.

Subsequently, again as shown in FIG. 4B, the semiconductor chip 20b is placed on the resin film 32a in the state where the surface of the semiconductor chip 20b on which the bumps 23 are mounted is directed downward (face down), and the semiconductor chip 20 is pressed, thereby burying the semiconductor chip 20b in the resin film 32a. Thus, the semiconductor chip 20b excludes the resin film 32a, and the bumps 23 thereof come into contact with the second wiring patterns 28a. In addition, the backside of the semiconductor chip 20b and the upper surface of the resin film 32a are at almost the same height to be planarized.

At this time, the thickness of the semiconductor chip 20b and the thickness of the resin film 32a are appropriately adjusted so that the backside of the semiconductor chip 20b and the upper surface of the resin film 32a may be at almost the same height. For example, in the case where the thickness of the semiconductor chip 20b is approximately 30 fÊm and the heights of the bumps 23 are approximately 10 fÊm (total thickness: approximately 40 fÊm), the resin film 32a is formed so as to have a thickness of approximately 40 fÊm on the second wiring patterns 28a.

Next, the bumps 23 of the semiconductor chip 20b and the second wiring patterns 28a are joined. In the case where the bumps 23 of the semiconductor chip 20b are made of Au, wirings having Au films on the surfaces thereof are used as the second wiring patterns 28a, and the bumps 23 of the semiconductor chip 20b and the second wiring patterns 28a are joined by ultrasonic flip-chip mounting.

Alternatively, in the case where the bumps 23 of the semiconductor chip 20b are made of solder, Cu wirings or wirings having Au films on the surfaces thereof are used as the second wiring patterns 28a, and the bumps 23 of the semiconductor chip 20b and the second wiring patterns 28a are joined by reflow heating.

Note that the portions of the second wiring patterns 28a where the bumps 23 of the semiconductor chip 20b are joined are plated with Ni/Au.

Thereafter, the resin film 32a is cured by performing heat treatment at 130 to 200° C., thus obtaining a second interlayer insulation film 32.

This provides a structure in which the semiconductor chip 20b is buried in a planar state in the first interlayer insulation film 32 and in which the bumps 23 thereof are flip-chip bonded to the second wiring patterns 28a, as shown in FIG. 4B.

In the present embodiment, since the semiconductor chip 20b is buried in the resin film 32a uncured to be flip-chip bonded to the second wiring patterns 28a, the gap under the semiconductor chip 20b does not need to be filled with underfill resin but is filled with the resin film 32 which remains in the gap. Thus, the present embodiment also has the advantage that the step of filling the gap under the semiconductor chip 20b with underfill resin is not particularly required.

Figure 4C:
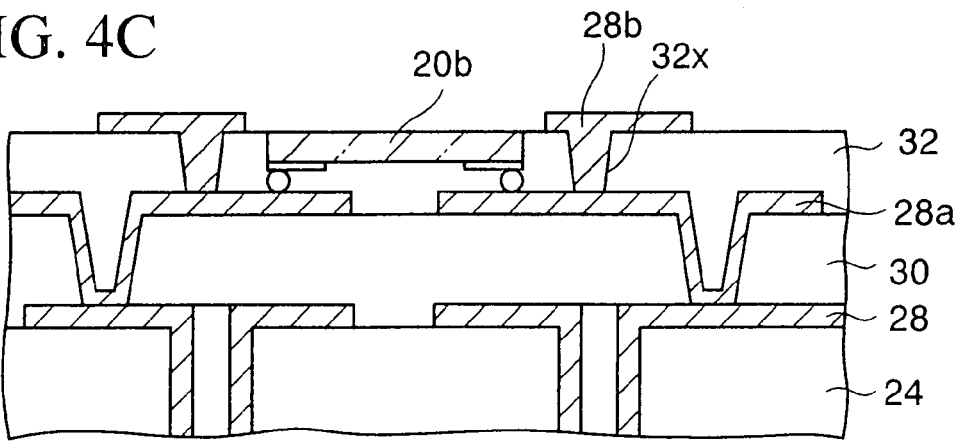

Next, as shown in FIG. 4C, predetermined portions of the second interlayer insulation film 32 on the second wiring patterns 28a are etched by a laser or RIE, thereby forming second via holes 32x.

Subsequently, third wiring patterns 28b (upper wiring patterns) connected to the second wiring patterns 28a through the second via holes 32x are formed on the second interlayer insulation film 32 by a semi-additive process, which is described in the first embodiment, or the like. Also in the third embodiment, the backside of the semiconductor chip 20b and the upper surface of the second interlayer insulation film 32 are at almost the same height to be planarized. Accordingly, the precision in photolithography when the third wiring patterns 28b are formed can be improved. Thus, the third wiring patterns 28b desired can be stably formed with high precision.

In the present embodiment, a mode in which a semiconductor chip thinned by grinding the backside thereof is used as the semiconductor chip 20b is exemplified. Accordingly, the third wiring patterns 28b are not formed on the backside of the semiconductor chip 20b for preventing the third wiring patterns 28b and circuit patterns of the semiconductor chip 20b from being electrically short-circuited. Note that, in the case where an insulation film is formed on the backside of the semiconductor chip 20b in advance, the third wiring patterns 28b may be formed on the backside of the semiconductor chip 20b.

In the third embodiment, similar to the first embodiment, a mode in which a plurality of semiconductor chips 20b are mutually connected in the state where they are buried in respective interlayer insulation films to be multilayered, may also be adopted by repeating the process from the step (FIG. 4A) of forming the first resin film 32a to the step (FIG. 4C) of forming the third wiring patterns 28b with a predetermined number of times.

Figure 4D:
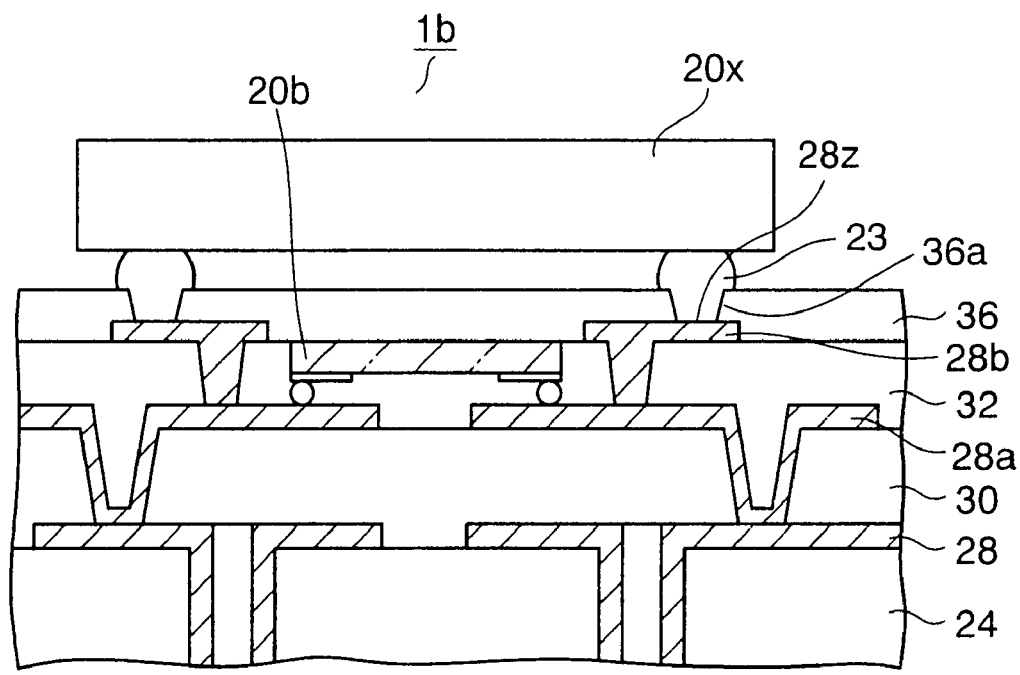

Next, as shown in FIG. 4D, a solder resist film 36 having opening portions 36a on connection portions 28z of the third wiring patterns 28b is formed. Thereafter, bumps 23 of an upper semiconductor chip 20x (upper electronic parts) including the bumps 23 are flip-chip bonded to the connection portions 28z of the third wiring patterns 28b. Also in the third embodiment, since the connection portions 28z of the third wiring patterns 28b do not vary in height to be placed at almost the same height, the bumps 23 of the upper semiconductor chip 20x can be joined to the connection portions 28z with high reliability.

In this way, a semiconductor device 1b (electronic-parts-packaging structure) of the third embodiment is obtained.

In the method of manufacturing the electronic-parts-packaging structure of the third embodiment, the semiconductor chip 20b is buried face down in the resin film 32a uncured, and the bumps 23 of the semiconductor chip 20b are flip-chip bonded to the second wiring patterns 28a.

Thus, without adding a special planarization process, the semiconductor chip 20b is buried in the second interlayer insulation film 32 in the state where steps due to the thickness of the semiconductor chip 20b are eliminated, and is flip-chip bonded to the second wiring patterns. Accordingly, similar to the first embodiment, the third wiring patterns 28b can be stably formed with high precision, and the upper semiconductor chip 20x can be flip-chip bonded to the third wiring patterns 28b with high reliability.

Moreover, since the gap under the semiconductor chip 20b does not need to be filled with underfill resin specially, there is the advantage that the cost of manufacture can be reduced.

Fourth Embodiment

FIGS. 5A to 5E are sectional views showing a method of manufacturing an electronic-parts-packaging structure of a fourth embodiment of the present invention in order. The fourth embodiment is different from the third embodiment in that after a semiconductor chip is mounted by a similar method to that of the third embodiment, an insulation film is formed on the semiconductor chip. This enables wiring patterns to be also formed in the region above the semiconductor chip. In the fourth embodiment, a detailed description of the same steps as those of the first and third embodiments will be omitted.

Figure 5A:
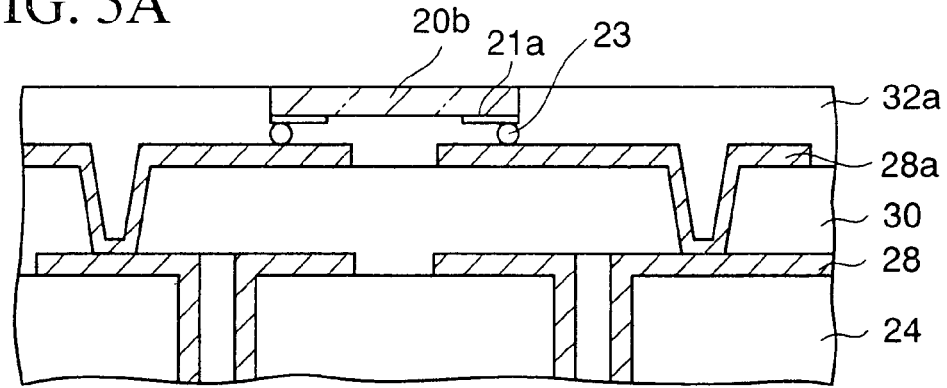
FIGS. 5A to 5E are sectional views showing a method of manufacturing an an electronic-parts-packaging structure of a fourth embodiment of the present invention in order.

In the method of manufacturing the electronic-parts-packaging structure of the fourth embodiment of the present invention, as shown in FIG. 5A, first, by a similar method to that of the third embodiment, a semiconductor chip 20b (electronic parts) is buried face down in a first resin film 32a uncured, and bumps 23 of the semiconductor chip 20b are flip-chip bonded to second wiring patterns 28a.

Figure 5B:
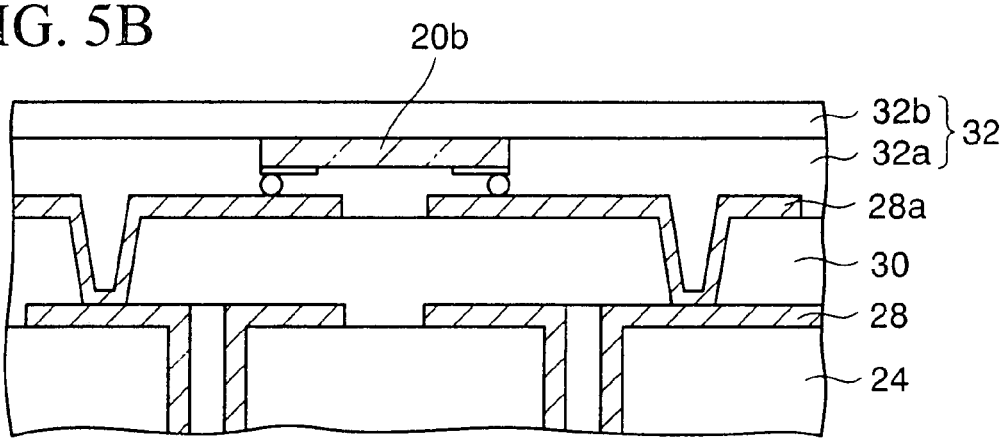

Thereafter, as shown in FIG. 5B, a second resin film 32b uncured, which covers the semiconductor chip 20b, is formed. Subsequently, the first and second resin films 32a and 32b are heat-treated at a temperature of 130 to 200° C. while being pressed in a vacuum environment, thereby simultaneously curing the first and second resin films 32a and 32b. Thus, a second interlayer insulation film 32 composed of the first and second resin films 32a and 32b is obtained.

Figure 5C:
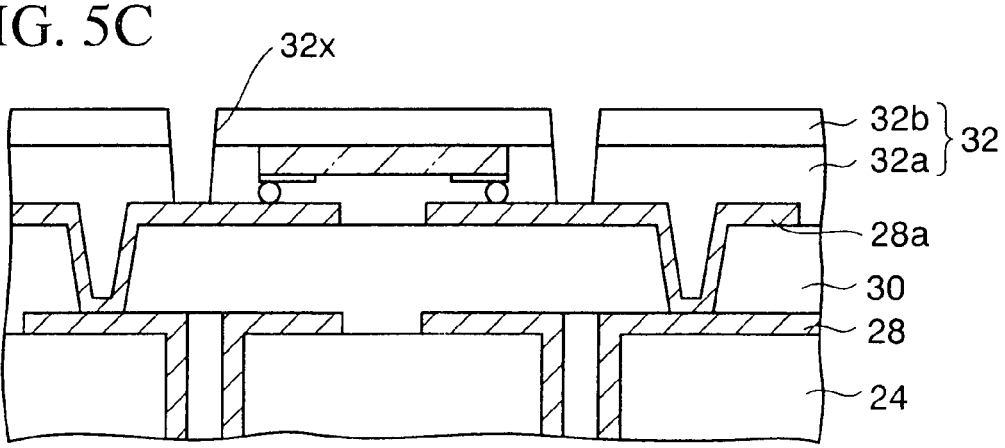

Then, as shown in FIG. 5C, predetermined portions of the second interlayer insulation film 32 on the second wiring patterns 28a are etched by a laser or RIE, thereby forming second via holes 32x.

Figure 5D:
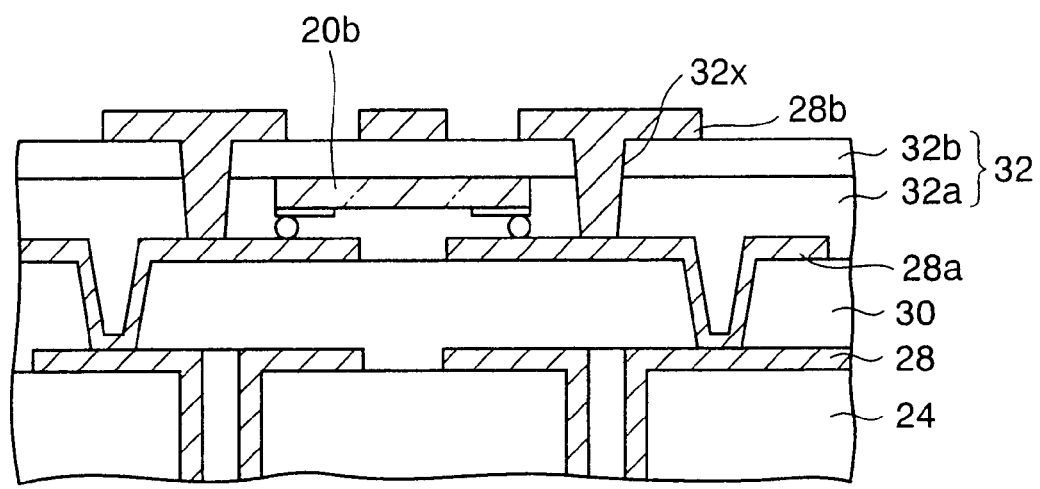

Subsequently, as shown in FIG. 5D, third wiring patterns 28b (upper wiring patterns) connected to the second wiring patterns 28a through the second via holes 32x are formed on the second interlayer insulation film 32 by a sub-additive process, which is described in the first embodiment, or the like.

The semiconductor chip 20b used in the present embodiment is one thinned to 150 μm (preferably, 50 μm) or less by grinding the backside thereof, and a semiconductor (silicon) layer is exposed on the backside of the semiconductor chip 20b. Therefore, in the case where the third wiring patterns 28b are formed directly on the backside of the semiconductor chip 20b, the third wiring patterns 28b and circuit patterns of the semiconductor chip 20b may be electrically short-circuited. Accordingly, in the aforementioned third embodiment, the third wiring patterns 28b are not placed on the semiconductor chip 20b.

However, in the fourth embodiment, as shown in FIG. 5D, the second resin film 32b is provided on the semiconductor chip 20b, and the third wiring patterns 28b are formed on the second resin film 32b. Therefore, the third wiring patterns 28b can also be placed in the region above the semiconductor chip 20b.

That is, in the fourth embodiment, flexibility in designing the third wiring patterns 28b can be increased compared to the third embodiment. Therefore, the wiring density of the electronic-parts-packaging structure can be increased, thus making it possible to easily cope with the trend toward smaller electronic-parts-packaging structures and that toward higher-performance ones.

Figure 5E:
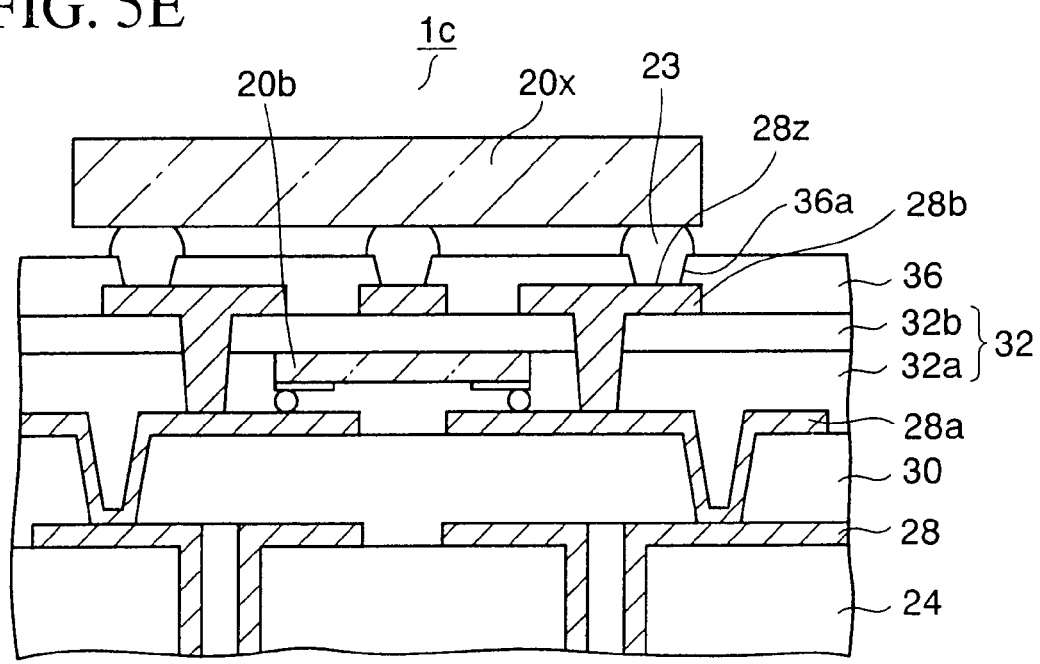

Next, as shown in FIG. 5E, a solder resist film 36 having opening portions 36a on connection portions 28z of the third wiring patterns 28b is formed. Furthermore, bumps 23 of an upper semiconductor chip 20x (upper electronic parts) are flip-chip bonded to the connection portions 28z of the third wiring patterns 28b.

In this way, a semiconductor device 1c (electronic-parts-packaging structure) of the fourth embodiment is obtained.

In the fourth embodiment, similar effects to those of the third embodiment are exerted. In addition, since the backside of the semiconductor chip 20b is covered with the second interlayer insulation film 32 (the second resin film 32b), the third wiring patterns 28b can also be formed above the semiconductor chip 20b, thus making it possible to increase the wiring density.

Fifth Embodiment

FIGS. 6A to 6H are sectional views showing a method of manufacturing an electronic-parts-packaging structure of a fifth embodiment of the present invention in order. In the aforementioned third and fourth embodiments, bumps of a semiconductor chip are joined to wiring patterns while a resin film is being excluded. Accordingly, a small amount of resin may be interposed between the bumps of the semiconductor chip and the wiring patterns, and there may be cases where sufficient reliability of electric connection cannot be obtained. In the fifth embodiment, such a trouble can be eliminated. Note that, in the fifth embodiment, a detailed description of the same steps as those of the first and third embodiments will be omitted.

Figure 6A:
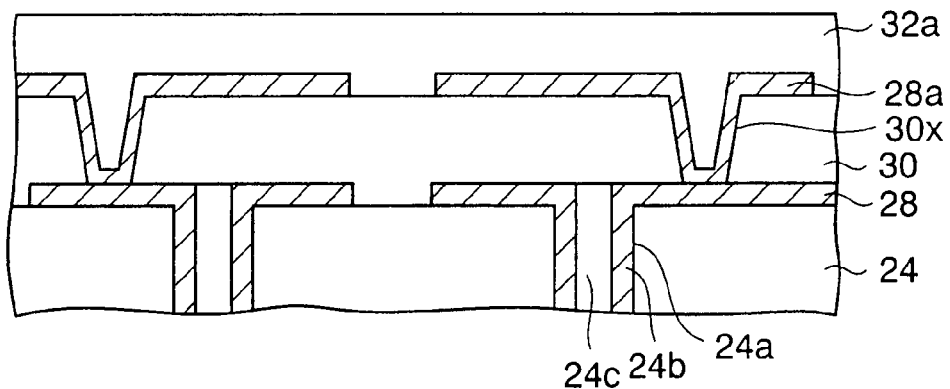
FIGS. 6A to 6H are sectional views showing a method of manufacturing an an electronic-parts-packaging structure of a fifth embodiment of the present invention in order.

In the method of manufacturing the electronic-parts-packaging structure of the fifth embodiment, as shown in FIG. 6A, first, by a similar method to that of the first embodiment, a first resin film 32a uncured is formed by, for example, adhering a resin film to a first interlayer insulation film 30 and second wiring patterns 28a on a base substrate 24.

Figure 6B:
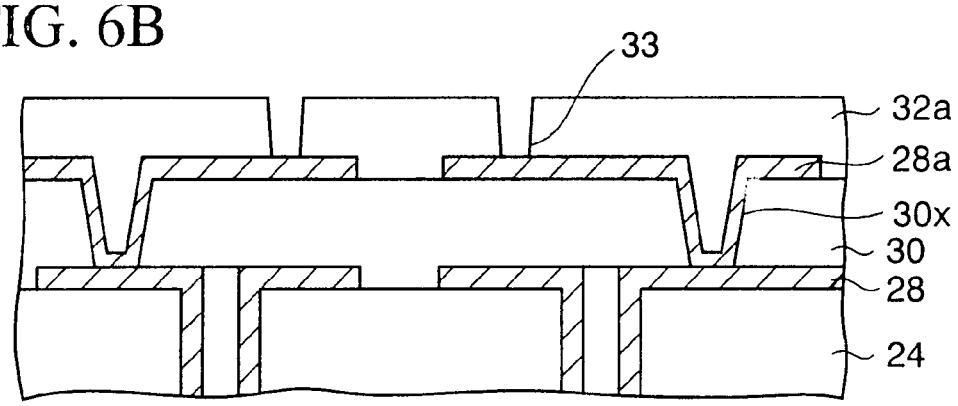

Thereafter, as shown in FIG. 6B, portions of the first resin film 32a on the second wiring patterns 28a to which bumps of a semiconductor chip are connected later are etched by a laser or the like, thereby forming opening portions 33 having depths reaching the second wiring patterns 28a.

At this time, the portions of the second wiring patterns 28a to which the bumps 23 of the semiconductor chip 20b are joined are plated with Ni/Au, and Ni/Au layers are exposed in the opening portions 33. Moreover, since the bumps of the semiconductor chip are placed in the opening portions 33 later, the diameters of the opening portions 33 are set equal to or more than the diameters of the bumps 23 of the semiconductor chip 20b.

Figure 6C:
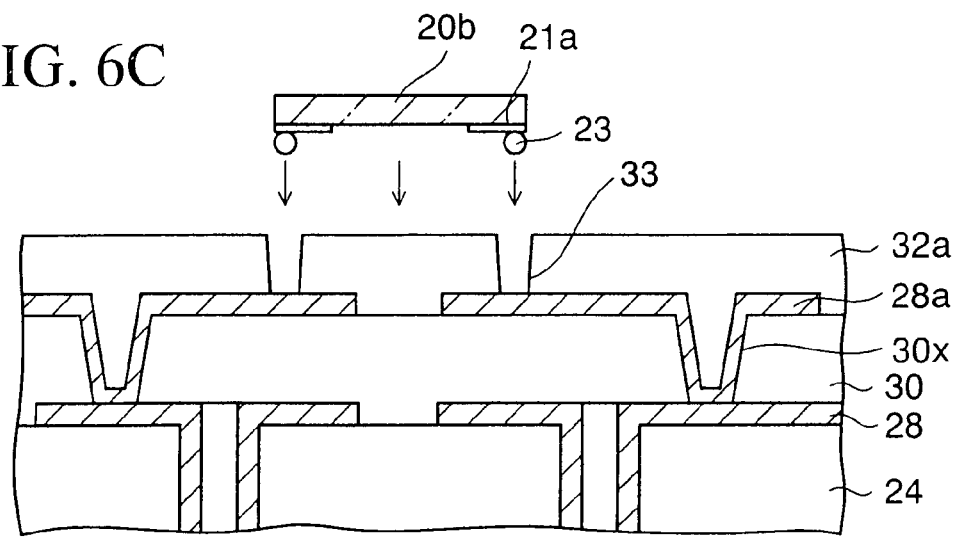

Next, as shown in FIG. 6C, the semiconductor chip 20b (electronic parts) including connection pads 21a and the bumps 23 connected to the connection pads 21a is prepared. Similar to the third embodiment, the thickness of the semiconductor chip 20b is thinned to approximately 150 μm or less.

Then, the semiconductor chip 20b is placed and pressed on the first resin film 32a so that the bumps 23 of the semiconductor chip 20b may correspond to the portions of the second wiring patterns 28a which are exposed in the opening portions 33 of the first resin film 32a. Thus, the bumps 23 of the semiconductor chip 20b are placed on the second wiring patterns 28a in contact therewith without excluding the first resin film 32a.

Figure 6D:
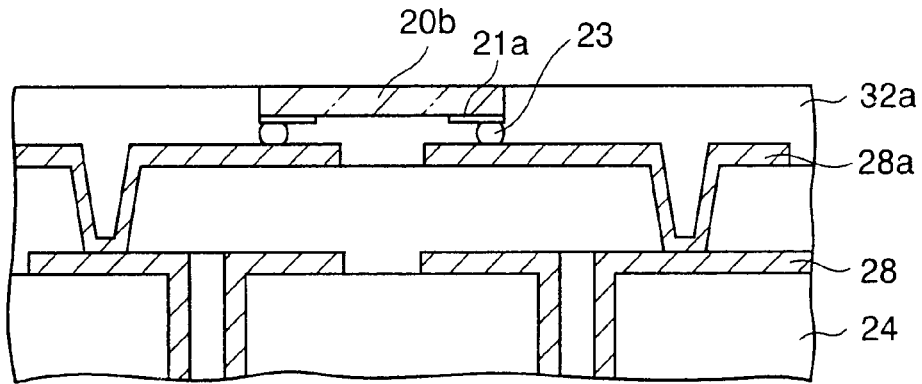

Subsequently, as shown in FIG. 6D, similar to the third embodiment, the bumps 23 of the semiconductor chip 20b are joined to the second wiring patterns 28a. As a joining method, ultrasonic flip-chip mounting is employed in the case where the bumps 23 of the semiconductor chip 20b are made of Au, but flip-chip mounting by reflow heating at 200 to 250° C. is employed in the case where the bumps 23 of the semiconductor chip 20b are made of solder.

Incidentally, when the bumps 23 of the semiconductor chip 20b are placed in the opening portions 33 of the first resin film 32a, a little gap remains between the semiconductor chip 20b and the side surfaces of the opening portions 33 of the first resin film 32a. In the case where thermosetting resin is used for the first resin film 32a, the side surfaces of the opening portions 33 thereof are cured to a certain degree by heat when the opening portions 33 are formed by a laser. Accordingly, the embedding effect by reflowing the first resin film 32a is relatively small. Therefore, in the present embodiment, in the case where the bumps 23 of the semiconductor chip 20b are solder bumps, the bumps 23 are reflowed and cured to be deformed, thereby filling the gap. Thereafter, the first resin film 32a is cured by performing heat treatment in an environment at a temperature of 130 to 200° C.

Incidentally, to cite a modified example, the aforementioned gap may be filled by using, as the first resin film 32a, light-curing resin having characteristics in which the light-curing resin reflows into the opening portions 33 when being cured by irradiation of ultraviolet light. This is because, in the case of light-curing resin, when the opening portions 33 are formed by a laser, the side surfaces thereof are not cured.

Moreover, in the case where solder is used for the bumps 23 of the semiconductor chip 20b, it is also possible to simultaneously cure the first resin film 32a by heat treatment when solder is reflowed and cured.

Thus, the semiconductor chip 20b is flip-chip bonded to the second wiring patterns 28a in the state where the semiconductor chip 20b is buried in the first resin film 32a. Further, similar to the third embodiment, the thickness of the first resin film 32a is adjusted in accordance with the thickness of the semiconductor chip 20b. Accordingly, the backside of the semiconductor chip 20b and the upper surface of the first resin film 32a are at almost the same height, thus eliminating steps due to the semiconductor chip 20b.

Incidentally, the backside of the semiconductor chip 20b and the upper surface of the first resin film 32a do not necessarily need to be set at the same height. In the case were a second resin film for covering the semiconductor chip 20b is formed as described later, planarization may be completely achieved with the second resin film.

In the fifth embodiment, after the opening portions 33 are formed in the first resin film 32a, the bumps 23 of the semiconductor chip 20b are joined to the second wiring patterns 28a exposed in the opening portions 33. Accordingly, there is no possibility that resin may be interposed at the joint interface between the bumps 23 of the semiconductor chip 20b and the second wiring patterns 28a. Therefore, the bumps 23 of the semiconductor chip 20b are joined to the second wiring patterns 28b with high reliability, thus making it possible to obtain favorable electric connection.

Figure 6E:
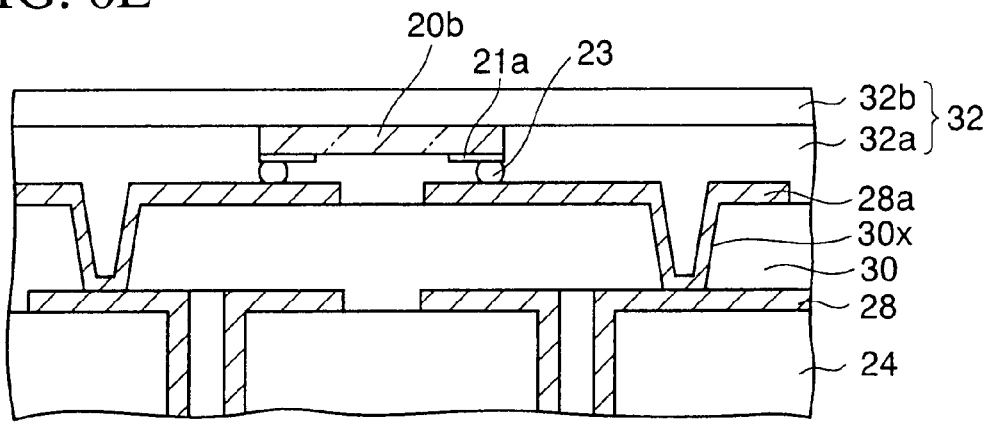

Subsequently, as shown in FIG. 6E, the second resin film 32b is formed on the first resin film 32a and the semiconductor chip 20b. Thus, a second interlayer insulation film 32 composed of the first and second resin films 32a and 32b is obtained.

Note that the following may be adopted: before the first resin film 32a is cured, the second resin film 32b uncured is formed on the first resin film 32a, and then the first and second resin films 32a and 32b are simultaneously cured by performing heat treatment.

Figure 6F:
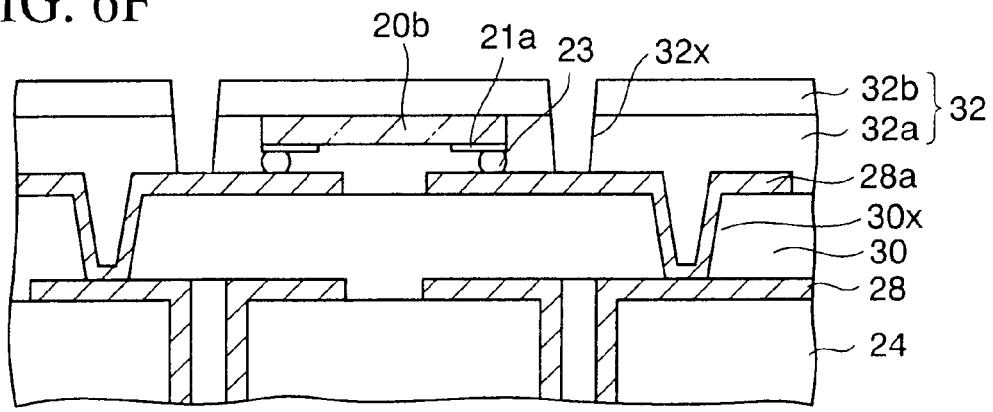
Figure 6G:
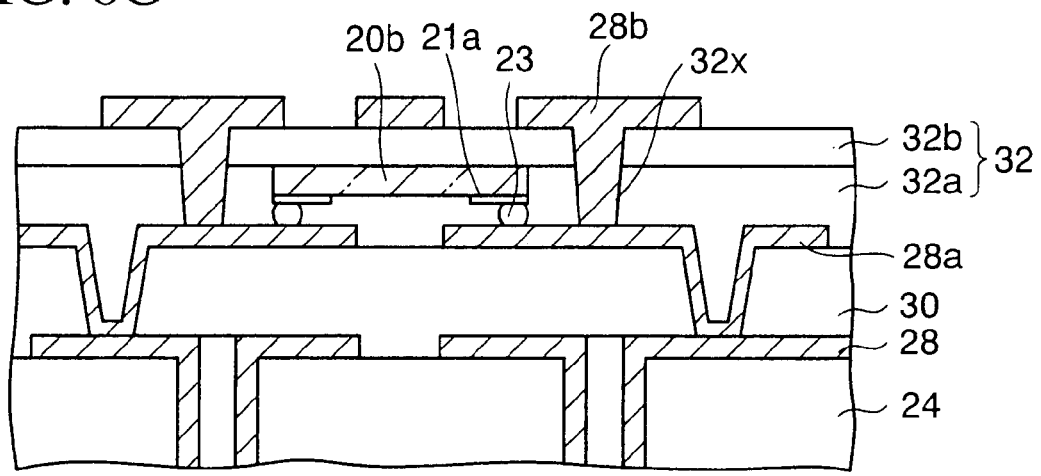

Next, as shown in FIG. 6F, predetermined portions of the second interlayer insulation film 32 on the second wiring patterns 28a are etched by a laser or RIE, thereby forming second via holes 32x.

Figure 6H:
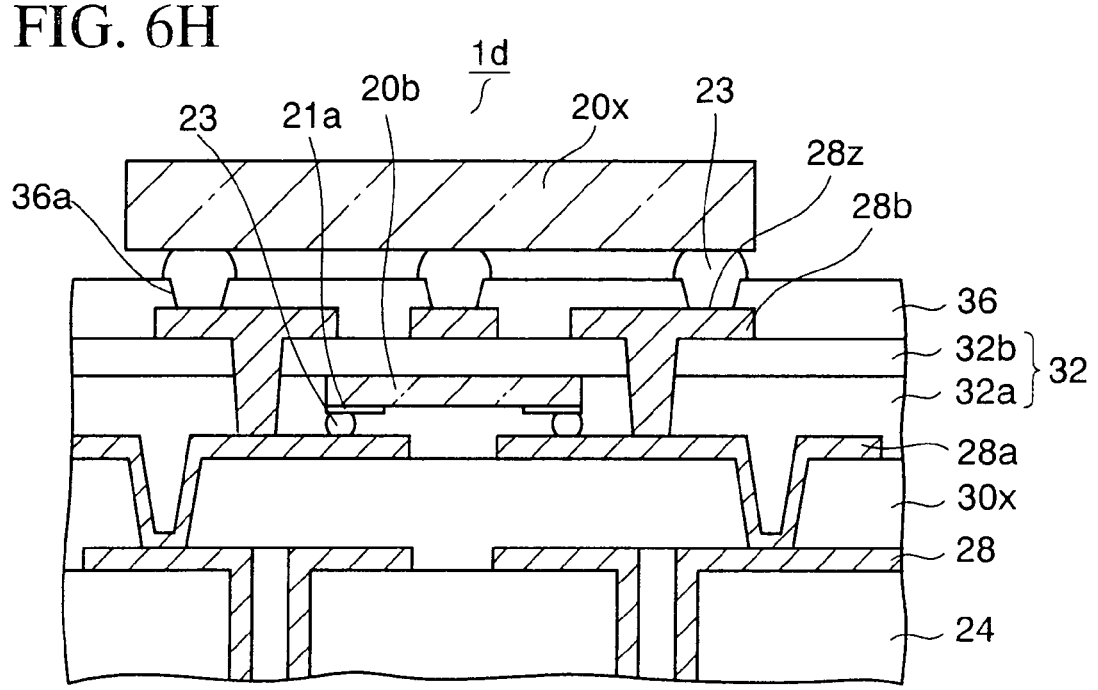

Subsequently, as shown in FIG. 6H, third wiring patterns 28b (upper wiring patterns) connected to the second wiring patterns 28a through the second via holes 32x are formed on the second interlayer insulation film 32 by a semi-additive process, which is described in the first embodiment, or the like.

Incidentally, to cite a modified example, similar to the third embodiment, a mode in which the second resin film 32b is not formed may be adopted. In this case, a similar structure to that of FIG. 4C is obtained, and the third wiring patterns 28b are formed on the first resin film 32a except the region on the semiconductor chip 20b.

Moreover, also in the fifth embodiment, a mode in which a plurality of semiconductor chips 20b are mutually connected in the state where they are buried in respective interlayer insulation films to be multilayered, may be adopted by repeating the process from the step (FIG. 6A) of forming the first resin film 32a to the step (FIG. 6G) of forming the third wiring patterns 28b with a predetermined number of times.

Subsequently, as shown in FIG. 6H, after a solder resist film 36 having opening portions 36a on connection portions 28z of the third wiring patterns 28b is formed, the connection portions 28z of the third wiring patterns 28b are plated with Ni/Au. Thereafter, bumps 23 of an upper semiconductor chip 20x (upper electronic parts) are flip-chip bonded to the connection portions 28z of the third wiring patterns 28b. Furthermore, the gap between the upper semiconductor chip 20x and the solder resist film 36 is filled with underfill resin as needed.

In this way, a semiconductor device 1d (electronic-parts-packaging structure) of the fifth embodiment is obtained.

In the fifth embodiment, similar to other embodiments, without adding a special planarization process, the semiconductor chip 20b is buried in the second interlayer insulation film 32 in the state where steps due to the semiconductor chip 20b are eliminated, and is flip-chip bonded to the second wiring patterns 28a. Accordingly, similar to other embodiments, the third wiring patterns 28b can be stably formed with high precision, and the upper semiconductor chip 20x can be flip-chip bonded to the third wiring patterns 28b with high reliability.

Moreover, in the present embodiment, there is no need to form a non conductive paste (NCP) or a non conductive film (NCF) before the semiconductor chip 20b is mounted, and there is no need to fill underfill resin after the semiconductor chip 20b is mounted. That is, since the first resin film 32a in which the semiconductor chip 20b is buried also has a function of NCP or an NCF in the prior art, the number of steps in the manufacturing process can be reduced, thereby making it possible to reduce the cost of manufacture.

In addition, the opening portions 33 are previously formed in the first resin film 32a in which the semiconductor chip 20b is to be buried, and the bumps 23 of the semiconductor chip 20b are joined to the portions of the second wiring patterns 28a exposed in the opening portions 33. Thus, the bumps 23 of the semiconductor chip 20b are electrically connected to the second wiring patterns 28a with higher reliability than the third or fourth embodiment, and the manufacturing yield of semiconductor devices 1d can be improved.

What is claimed is:

1. A method of manufacturing an electronic-parts-packaging structure, comprising the steps of:

forming a first resin film uncured on a wiring substrate including a wiring pattern, before a plurality of electronic parts are mounted;

burying the electronic parts having a connection terminal on an element formation surface in the first resin film uncured in a state where the connection terminal is directed upward, by pushing the electronic parts from a surface of the first resin film uncured to inside the first resin film uncured, and a back surface of the first resin film uncured, and the back surface side of the electronic parts being electrically isolated from the wiring substrate;

forming a second resin film for covering the electronic parts; obtaining an insulation film by curing the first and second resin films by heat treatment;

forming a via hole in a predetermined portion of the insulation film on the wiring pattern and the connection terminal; and forming an upper wiring pattern connected to the wiring pattern and the connection terminal through the via hole, on the insulation film.

2. A method of manufacturing an electronic-parts-packaging structure, comprising the steps of:
forming a resin film uncured on a wiring substrate including a wiring pattern, the resin film uncured formed by laminating a resin film before a plurality of electronic parts are mounted;
burying the electronic parts, which has a connection terminal and a passivation film having an opening portion for exposing the connection terminal on an element formation surface, in the resin film uncured in a state where the connection terminal is directed upward, by pushing the electronic parts from a surface of the resin film uncured to inside the resin film uncured;
obtaining an insulation film by curing the resin film by heat treatment;
forming a via hole in a predetermined portion of the insulation film on the wiring pattern; and
forming an upper wiring pattern, which is connected to the wiring pattern through the via hole and connected to the connection terminal through the opening portion, on the insulation film and the electronic parts, the upper wiring pattern connected to the connection terminal of the electronic parts through the passivation film of the electronic parts.

3. A method of manufacturing an electronic-parts-packaging structure, comprising the steps of:
forming a resin film uncured on a whole region of a wiring substrate including a wiring pattern, before a plurality of electronic parts are mounted;
burying an electronic parts having a connection terminal on an element formation surface in the resin film uncured in a state where the connection terminal is directed downward, by pushing the electronic parts from a surface of the resin film uncured to inside the resin film uncured, and joining the connection terminal to the wiring pattern;
obtaining an insulation film by curing the resin film by heat treatment;
forming a via hole in a predetermined portion of the insulation film on the wiring pattern; and
forming an upper wiring pattern connected to the wiring pattern through the via hole, on the insulation film.

4. A method of manufacturing an electronic-parts-packaging structure, comprising the steps of:
forming a first resin film uncured on a whole region of a wiring substrate including a wiring pattern, before a plurality of electronic parts are mounted;
burying the electronic parts having a connection terminal on an element formation surface in the first resin film uncured in a state where the connection terminal is directed downward by pushing the electronic parts from a surface of the first resin film uncured to inside the first resin film uncured, and joining the connection terminal to the wiring pattern;
forming a second resin film for covering the electronic parts and the first resin film uncured;
obtaining an insulation film by curing the first and second resin films by heat treatment;
forming a via hole in a predetermined portion of the insulation film on the wiring pattern; and
forming an upper wiring pattern connected to the wiring pattern through the via hole, on the insulation film.

5. The method according to any one of claims 3 and 4, after the step of forming the resin film uncured and before the step of joining the connection terminal of the electronic parts to the wiring pattern, further comprising the step of: forming an opening portion in a portion of the resin film on the wiring pattern to which the connection terminal of the electronic parts is joined, wherein the step of joining the connection terminal of the electronic parts to the wiring pattern includes placing the connection terminal of the electronic parts while making the connection terminal of the electronic parts correspond to the opening portion of the resin film.

6. The method according to claim 5, wherein the connection terminal of the electronic parts is a solder bump, and wherein in the step of joining the connection terminal of the electronic parts to the wiring pattern, a gap between the electronic parts and a side surface of the opening portion of the resin film is filled by deforming the solder bump by reflowing and curing.

7. The method according to any one of claims 1 to 4, wherein in the step of burying the electronic parts in the resin film uncured, an upper surface of the resin film uncured and any one of the element formation surface and a backside of the electronic parts are set at an almost same height.

8. The method according to any one of claims 1 and 2, wherein in the step of burying the electronic parts in the resin film uncured, the resin film is interposed between a backside of the electronic parts and the wiring substrate.

9. The method according to claim 3, wherein in the step of forming the upper wiring pattern, the upper wiring pattern is not formed on the electronic parts.

10. The method according to any one of claims 1 to 4, further comprising the step of: repeating the steps from the step of burying the electronic parts in the resin film to the step of forming the upper wiring pattern with a predetermined number of times.

11. The method according to any one of claims 1 to 4, further comprising the step of, flip-chip bonding an upper electronic parts to the upper wiring pattern.

12. The method according to any one of claims 1 to 4, wherein the electronic parts is a semiconductor chip having a thickness of approximately 150 µm or less.

* * * * *